(12) United States Patent
Kondo et al.

(10) Patent No.: US 12,665,386 B2
(45) Date of Patent: Jun. 23, 2026

(54) LIGHT-EMITTING DEVICE AND MEASUREMENT DEVICE

(71) Applicant: FUJIFILM Business Innovation Corp., Tokyo (JP)

(72) Inventors: Takashi Kondo, Ebina (JP); Michiaki Murata, Ebina (JP); Kenichi Ono, Ebina (JP); Junichiro Hayakawa, Ebina (JP); Takafumi Higuchi, Ebina (JP); Takashi Fujimoto, Ebina (JP); Manabu Akamatsu, Ebina (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 1338 days.

(21) Appl. No.: 17/411,821

(22) Filed: Aug. 25, 2021

(65) Prior Publication Data

US 2022/0311209 A1 Sep. 29, 2022

(30) Foreign Application Priority Data

Mar. 29, 2021 (JP) ................................. 2021-054456
Apr. 20, 2021 (JP) ................................. 2021-071314

(51) Int. Cl.
*H01S 5/042* (2006.01)
*G01S 17/08* (2006.01)
*H01S 5/42* (2006.01)

(52) U.S. Cl.
CPC ............ *H01S 5/0425* (2013.01); *G01S 17/08* (2013.01); *H01S 5/423* (2013.01)

(58) Field of Classification Search
CPC .... H01S 5/0425; H01S 5/423; H01S 5/04256; H01S 5/18311; H01S 5/042; G01S 17/08;
(Continued)

(56) References Cited

U.S. PATENT DOCUMENTS 5,451,977 A 9/1995 Kusuda et al.
5,814,841 A 9/1998 Kusuda et al.
(Continued)

FOREIGN PATENT DOCUMENTS

JP H01-238962 A 9/1989
JP 2001-308385 A 11/2001
(Continued)

OTHER PUBLICATIONS

Jan. 14, 2025 Office Action issued in Japanese Patent Application No. 2021-054456.
(Continued)

*Primary Examiner* — Isam A Alsomiri
*Assistant Examiner* — Joseph C Fritchman
(74) *Attorney, Agent, or Firm* — Oliff PLC

(57) ABSTRACT

A light-emitting device includes: a substrate; a light-emitting unit including plural light-emitting elements; a transfer unit configured to output a signal that controls a light-emitting state of the light-emitting elements; and an electrode unit configured to input and output a signal that drives the transfer unit, the substrate has a rectangular shape having a long side and a short side, and the electrode unit is disposed along the short side of the substrate with the transfer unit interposed between a part of the electrode unit and other part of the electrode unit.

16 Claims, 12 Drawing Sheets

(58) Field of Classification Search
CPC ..... G01S 7/4815; G01S 7/484; H10H 20/831;
H10H 20/83
See application file for complete search history.

(56) References Cited

U.S. PATENT DOCUMENTS

| | | | |
|---|---|---|---|
| 10,477,635 B1 * | 11/2019 | Kondo | ................. H10H 29/142 |
| 2016/0182891 A1 | 6/2016 | Ko et al. | |
| 2017/0277065 A1 | 9/2017 | Kondo | |
| 2018/0234583 A1 * | 8/2018 | Kondo | ................. H10F 30/263 |
| 2020/0077478 A1 * | 3/2020 | Kondo | ................. H10H 20/813 |
| 2020/0209355 A1 * | 7/2020 | Pacala | ................... G01S 7/4817 |
| 2020/0244039 A1 | 7/2020 | Kondo et al. | |
| 2021/0091535 A1 | 3/2021 | Kondo et al. | |

FOREIGN PATENT DOCUMENTS

| | | |
|---|---|---|
| JP | 2010-111085 A | 5/2010 |
| JP | 2010-162889 A | 7/2010 |
| JP | 2012-089882 A | 5/2012 |
| JP | 2017-174906 A | 9/2017 |
| JP | 2019-212742 A | 12/2019 |
| JP | 2020-035879 A | 3/2020 |
| JP | 2020-120018 A | 8/2020 |

OTHER PUBLICATIONS

Sep. 3, 2024 Office Action issued in Japanese Patent Application No. 2021-071314.
Sep. 3, 2024 Office Action issued in Japanese Patent Application No. 2021-054456.
Jun. 10, 2025 Office Action issued in Japanese Patent Application No. 2021-054456.

* cited by examiner

*FIG. 6*

LIGHT-EMITTING DEVICE AND MEASUREMENT DEVICE

CROSS-REFERENCE TO RELATED APPLICATIONS

This application is based on and claims priority under 35 USC 119 from Japanese Patent Application No. 2021-054456 filed on Mar. 29, 2021 and Japanese Patent Application No. 2021-071314 filed on Apr. 20, 2021.

BACKGROUND

1. Technical Field

The present invention relates to a light-emitting device and a measurement device.

2. Related Art

A light-emitting element array is known in which a large number of light-emitting elements whose threshold voltage or threshold current can be controlled by light from the outside are arranged one-dimensionally, two-dimensionally, or three-dimensionally, at least a part of the light generated from each light-emitting element is configured to be incident on the other light-emitting elements in the vicinity of each light-emitting element, and a clock line that applies a voltage or current from the outside is connected to each light-emitting element (JP-A-H01-238962).

A self-scanning light-emitting device is also known in which a light-emitting element having a pnpnpn 6-layer semiconductor structure is configured, electrodes are provided in a p-type 1st layer and an n-type 6th layer at both ends and a p-type 3rd layer and an n-type 4th layer in a center, a pn layer has a light-emitting diode function, and a pnpn4 layer has a thyristor function (JP-A-2001-308385).

A light-emitting component is known, which includes plural transfer elements configured to be sequentially brought into an on state, plural setting thyristors configured to be brought into a state where the setting thyristors are capable of changing to the on state when the transfer elements are brought into the on state, and plural light-emitting elements laminated on the plural setting thyristors through tunnel junctions, respectively, and configured to emit light or increase a light-emitting amount when the setting thyristors are brought into the on state (JP-A-2017-174906).

A light-emitting device, which includes a light-emitting unit including an array of plural light-emitting element groups each including plural light-emitting elements, is also known, and in the light-emitting unit, the plural light-emitting element groups are sequentially driven along the array such that, for each of the plural light-emitting element groups, the plural light-emitting elements included in the light-emitting element group are sequentially set to a state of emitting light or a state of not emitting light (JP-A-2020-120018).

SUMMARY

Aspects of non-limiting embodiments of the present disclosure relate to reducing a size of the light-emitting device as compared with a case where an electrode unit is disposed in a longitudinal direction of the light-emitting device.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light-emitting device including: a substrate; a light-emitting unit including plural light-emitting elements; a transfer unit configured to output a signal that controls a light-emitting state of the light-emitting elements; and an electrode unit configured to input and output a signal that drives the transfer unit, wherein the substrate has a rectangular shape having a long side and a short side, and the electrode unit is disposed along the short side of the substrate with the transfer unit interposed between a part of the electrode unit and other part of the electrode unit.

BRIEF DESCRIPTION OF THE DRAWINGS

Exemplary embodiments of the present invention will be described in detail based on the following figures, wherein:

FIG. 6 is a diagram showing a cross-sectional structure of the light-emitting device;

DETAILED DESCRIPTION

Next, the present disclosure will be described in more detail with reference to the drawings below with reference to exemplary embodiments and specific examples, but the present disclosure is not limited to these exemplary embodiments and specific examples.

In the following description using the drawings, the drawings are schematic, and it should be noted that ratios of dimensions and the like are different from actual ones, and illustration other than members necessary for description is omitted as appropriate for easy understanding.

(1-1) Overall Configuration of Light-Emitting Device

Figure 1:
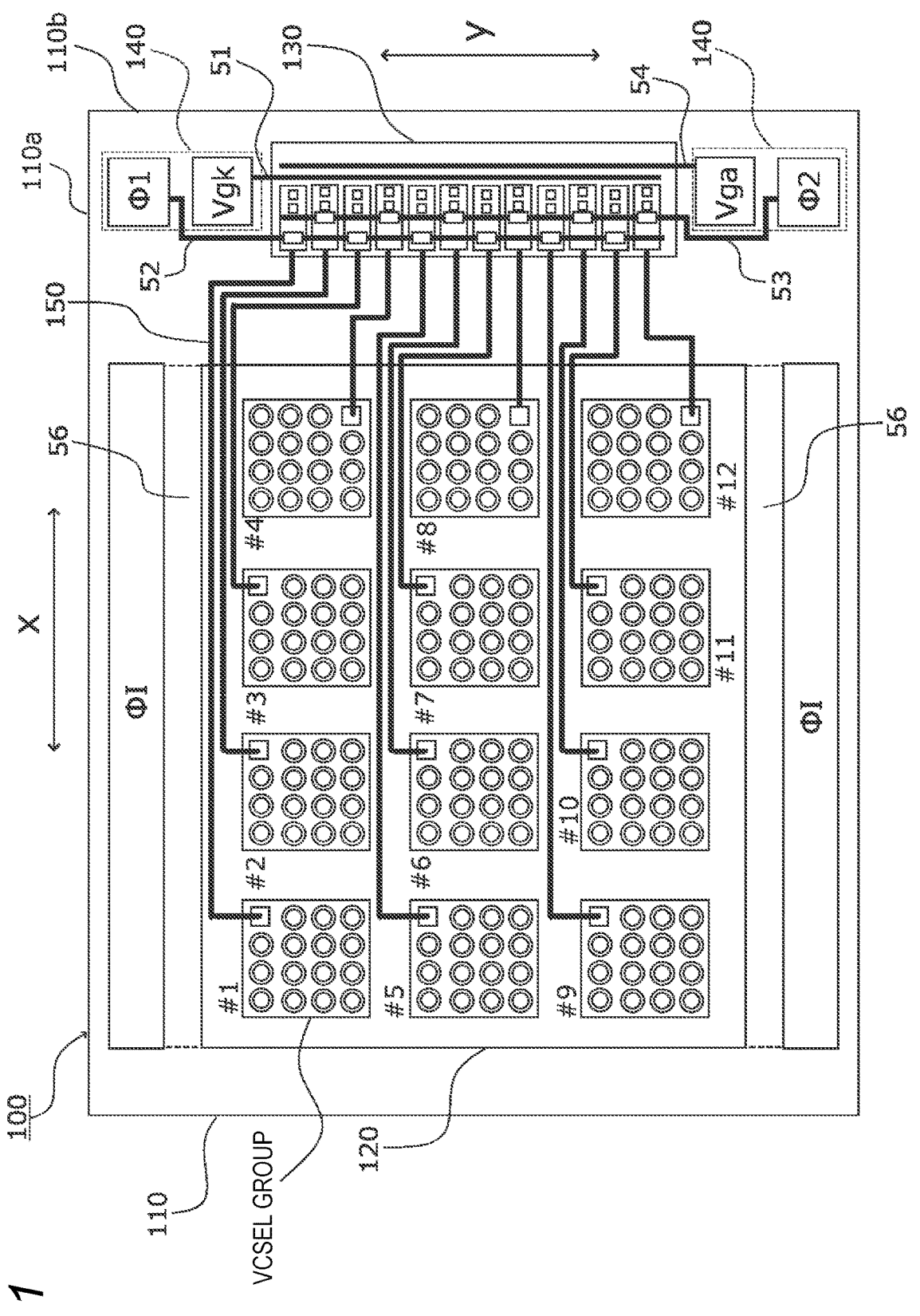
FIG. 1 is a diagram showing an example of a planar layout of a light-emitting device according to a first exemplary embodiment.
Figure 2:
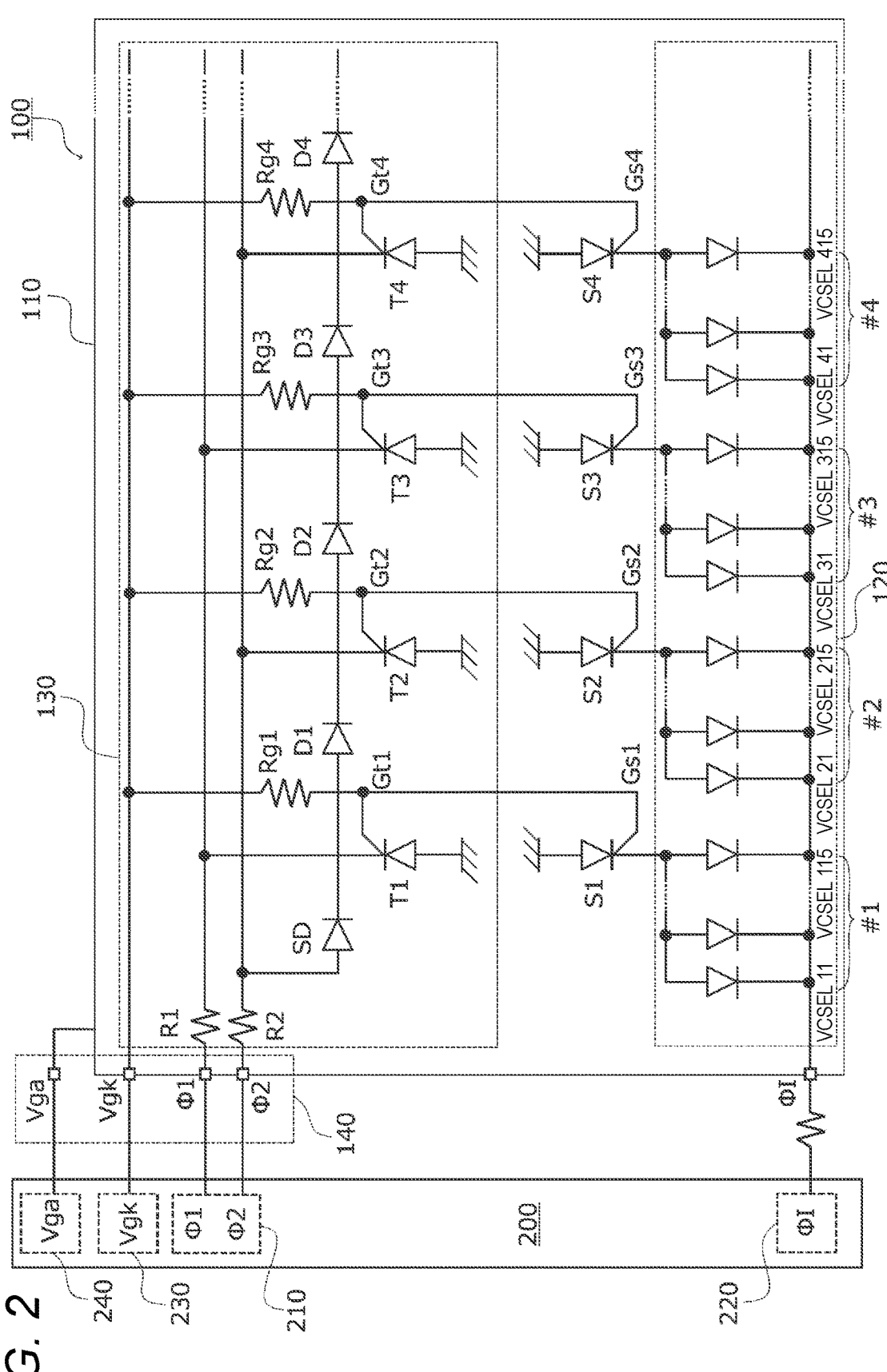
FIG. 2 is a schematic equivalent circuit diagram of the light-emitting device according to the first exemplary embodiment.

FIG. 1 is a diagram showing an example of a planar layout of a light-emitting device 100 according to a first exemplary embodiment, and FIG. 2 is a schematic equivalent circuit diagram of the light-emitting device 100 according to the first exemplary embodiment. In FIG. 2, a control unit 200 that controls the light-emitting device 100 is also shown.

As shown in FIG. 1, the light-emitting device 100 of the first exemplary embodiment includes a substrate 110, a light-emitting unit 120 including plural light-emitting elements, a transfer unit 130 that controls light-emitting of the light-emitting elements, and a common signal line 150 that connects the light-emitting unit 120 and the transfer unit 130 to each other.

The light-emitting unit 120 as an example of the light-emitting element includes plural laser diodes that emit laser light. Then, the light-emitting device 100 is configured as a self-scanning light-emitting device (SLED) as described below. In the first exemplary embodiment, the laser diode is, for example, a vertical cavity surface emitting laser (VCSEL). In the following, the light-emitting element will be described as a VCSEL, but other light-emitting devices such as a light-emitting diode LED may be used.

(1-2) Equivalent Circuit of Light-Emitting Device

First, a functional configuration of the light-emitting device 100 according to the first exemplary embodiment will be described with reference to an equivalent circuit of FIG. 2.

The light-emitting unit 120 includes plural VCSELs. As an example, one VCSEL group includes 15 VCSELs. FIG. 1 shows 12 VCSEL groups (VCSEL groups #1 to #12), and in the equivalent circuit diagram of FIG. 2, 4 VCSEL groups (VCSEL groups #1 to #4) which are a part thereof are shown. In the first exemplary embodiment, 15 VCSELs included in one VCSEL group are configured to be adjacent to each other such that regions of the VCSEL group are not dispersed.

Then, the light-emitting device 100 includes a drive thyristor S for each VCSEL group. The VCSEL group and the drive thyristor S are connected in series. Then, the drive thyristor S is also added an "i" which is a number of the VCSEL group. For example, the drive thyristor S included in the VCSEL group #1 is a drive thyristor S1.

The light-emitting device 100 further includes plural transfer thyristors T, plural coupling diodes D, plural power supply line resistors Rg, a start diode SD, and current limiting resistors R1 and R2. Here, when the plural transfer thyristors T are to be distinguished from each other, the transfer thyristors are distinguished by adding "i", which is the number of the VCSEL group, such as transfer thyristors T1, T2, T3, . . . . The same applies to the coupling diodes D and the power supply line resistors Rg. As will be described later, for example, the transfer thyristor T1 is provided so as to correspond to the VCSEL group #1. FIG. 2 shows a portion where i corresponds to 1 to 4. The "i" in the light-emitting device 100 may be a predetermined number. For example, the "i" may be 128, 512, 1024, or the like. The number of the transfer thyristors T may be the same as the number of the VCSEL groups. The number of the transfer thyristors T may exceed the number of the VCSEL groups or may be smaller than the number of the VCSEL groups.

The transfer thyristors T are arranged in the order of the transfer thyristors T1, T2, T3, . . . , and the coupling diodes D are arranged in the order of coupling diodes D1, D2, D3, . . . . The coupling diode D1 is provided between the transfer thyristor T1 and the transfer thyristor T2. The same applies to the other coupling diodes D. Further, the power supply line resistors Rg are also arranged in the order of power supply line resistors Rg1, Rg2, Rg3, . . . .

The VCSEL and the coupling diode D are two-terminal elements including an anode and a cathode. The drive thyristor S and the transfer thyristor T are three-terminal elements including an anode, a cathode, and a gate. Here, the gate of the transfer thyristor T is referred to as a gate Gt, and the gate of the drive thyristor S is referred to as a gate Gs. When the gates Gt and the gates Gs are to be distinguished, "i" is added as described above. The portion including the VCSEL is referred to as the light-emitting unit 120.

Next, a connection relationship of each element (the VCSEL, the drive thyristor S, the transfer thyristor T, or the like) will be described. As described above, a VCSEL ij and a drive thyristor Si are connected in series. That is, the anode of the drive thyristor Si is connected to a reference potential Vga (ground potential (GND) or the like), and the cathode of the drive thyristor Si is connected in parallel to the anode of the VCSEL ij. The cathode of the VCSEL ij is commonly connected to a lighting signal line 56 to which a lighting signal ΦI that controls the VCSEL ij to a state of emitting light or a state of not emitting light is supplied.

As will be described later, the reference potential Vga is supplied via a Vga terminal (see FIGS. 1 and 3 described later) provided on a back surface of the substrate 110 forming the light-emitting device 100.

The anode of the transfer thyristor T is connected to the reference potential Vga. The cathodes of the odd-numbered transfer thyristors T1, T3, . . . are connected to a transfer signal line 52. The transfer signal line 52 is connected to a Φ1 terminal, which is one of electrode pads forming an electrode unit 140, via the current limiting resistor R1.

The cathodes of the even-numbered transfer thyristors T2, T4, . . . are connected to a transfer signal line 53. The transfer signal line 53 is connected to a Φ2 terminal, which is one of the electrode pads forming the electrode unit 140, via the current limiting resistor R2.

The coupling diodes D are connected in series with each other. That is, the cathode of one coupling diode D is connected to the anode of the adjacent coupling diode D. An anode of the start diode SD is connected to the transfer signal line 53 and the cathode of the start diode SD is connected to the anode of the coupling diode D1.

Then, the cathode of the start diode SD and the anode of the coupling diode D1 are connected to a gate Gt1 of the transfer thyristor T1. The cathode of the coupling diode D1 and the anode of the coupling diode D2 are connected to a gate Gt2 of the transfer thyristor T2. The same applies to the other coupling diodes D.

The gate Gt of the transfer thyristor T is connected to a power supply line 51 via the power supply line resistor Rg. The power supply line 51 is connected to a Vgk terminal, which is one of the electrode pads forming the electrode unit 140. Then, a gate Gti of the transfer thyristor T1 is connected to a gate Gsi of the drive thyristor Si.

The configuration of a control unit 200 will be described. The control unit 200 generates a signal such as the lighting signal ΦI and supplies the signal to the light-emitting device 100, and the light-emitting device 100 operates by the signal supplied via the electrode unit 140.

The control unit 200 includes an electronic circuit. For example, the control unit 200 may be an integrated circuit (IC) configured to control an operation of the light-emitting device 100. The control unit 200 includes a transfer signal generation unit 210, a lighting signal generation unit 220, a power supply potential generation unit 230, and a reference potential generation unit 240.

The transfer signal generation unit 210 generates transfer signals Φ1 and Φ2, supplies the transfer signal Φ1 to the Φ1 terminal as an example of a transfer signal electrode of the light-emitting device 100, and supplies the transfer signal Φ2 to the Φ2 terminal as an example of the transfer signal electrode of the light-emitting device 100.

The lighting signal generation unit 220 generates the lighting signal ΦI and supplies the lighting signal ΦI to the ΦI terminal as an example of the lighting signal electrode of the light-emitting device 100 via a current limiting resistor RI. The current limiting resistor RI may be provided in the light-emitting device 100. Further, when the current limiting resistor RI is not necessary for the operation of the light-emitting device 100, the current limiting resistor RI may not be provided.

The power supply potential generation unit 230 generates the power supply potential Vgk and supplies the power supply potential Vgk to the Vgk terminal as an example of a power supply electrode of the light-emitting device 100. The reference potential generation unit 240 generates the reference potential Vga and supplies the reference potential Vga to the Vga terminal as an example of the power supply electrode of the light-emitting device 100. The power supply potential Vgk is −3.3 V as an example. As described above, the reference potential Vga is the ground potential (GND) as an example.

The transfer unit is driven based on the signals from these power supply electrodes and transfer signal electrodes.

The transfer signals Φ1 and Φ2 generated by the transfer signal generation unit 210 and the lighting signal ΦI generated by the lighting signal generation unit 220 will be described later.

In the light-emitting device 100 shown in FIG. 2, 15 VCSELs ij (j=1 to 15) as a VCSEL group are connected to one transfer thyristor Ti via the drive thyristor Si.

As will be described later, when the transfer thyristor Ti is brought into an on state, the drive thyristor Si connected to the transfer thyristor Ti is set so as to be able to change to the on state. Further, when the drive thyristor Si is brought into the on state, the VCSEL ij emits light. The transfer thyristor Ti is driven to change to the on state in the order of "i". That is, in the transfer thyristor Ti, the on state propagates in order. Accordingly, the transfer thyristor Ti causes the VCSEL group to emit light in sequence.

Here, one VCSEL group includes plural VCSELs (15 in the first exemplary embodiment). Then, the VCSEL group is connected to each transfer thyristor T, and the plural VCSELs included in the VCSEL group emit light in parallel. In the example shown in FIG. 2, each VCSEL group includes the same number of the VCSELs (here, 15), but the number of the VCSELs may differ between the VCSEL groups.

The VCSEL is preferably oscillated in a low-order single-transverse mode (single-mode). In the single-mode, an intensity profile of light (emitted light) emitted from a light-emitting point (light-emitting port 310 in FIG. 3 described later) of the VCSEL is monomodal (characteristic of having one intensity peak). On the other hand, in a VCSEL that oscillates in a multi-transverse mode (multi-mode) having high-order, the intensity profile tends to be distorted, such as having plural peaks. Further, in the single-mode, a spread angle of the light (emitted light) emitted from the light-emitting point is smaller than that in the multi-mode.

Then, the smaller the area of the light-emitting point, the easier the VCSEL to oscillate in the single-transverse mode (single-mode). Therefore, the VCSEL in the single-mode has small light output. If the area of the light-emitting point is increased in an attempt to increase the light output, the VCSEL is easy to change to the multi-mode. Therefore, the plural VCSELs are designated as a VCSEL group, and the plural VCSELs included in the VCSEL group are made to emit light in parallel to increase the light output.

(1-3) Planar Layout of Light-Emitting Device

Returning to FIG. 1, first, a planar layout of the transfer unit 130 and the electrode unit 140 in the light-emitting device 100 according to the first exemplary embodiment will be described. The substrate 110 of the light-emitting device 100 has a rectangular shape having a long side 110a and a short side 110b, and in FIG. 1, an x direction is a long side direction and a y direction is a short side direction.

As shown in FIG. 1, in the light-emitting device 100, the electrode unit 140 is disposed along the short side 110b of the substrate 110 with the transfer unit 130 interposed therebetween.

The electrode unit 140 includes the Φ1 terminal and the Φ2 terminal as the transfer signal electrodes for receiving the supply of the transfer signals Φ1 and Φ2 generated by the transfer signal generation unit 210 of the control unit 200, the Vgk terminal as the power supply electrode for receiving the supply of the power supply potential Vgk generated by the power supply potential generation unit 230, and the Vga terminal for receiving the supply of the reference potential Vga generated by the reference potential generation unit 240. Each terminal is a bonding pad.

The transfer signal line 52 extending from the Φ1 terminal of the electrode unit 140, the transfer signal line 53 extending from the Φ2 terminal, the power supply line 51 extending from the Vgk terminal, and a reference potential line 54 extending from the Vga terminal are formed as a conductive pattern in the transfer unit 130 of the light-emitting device 100.

In the transfer unit 130, the cathodes of the odd-numbered transfer thyristors T1, T3, . . . are connected to the transfer signal line 52, and the cathodes of the even-numbered transfer thyristors T2, T4, . . . are connected to the transfer signal line 53.

Accordingly, as shown in FIG. 1, between the control unit 200 and the transfer unit 130, the terminal and the Φ2 terminal for inputting and outputting the transfer signals Φ1 and 12, and the Vgk terminal and the Vga terminal for inputting and outputting the power supply potential Vgk and the reference potential Vga are disposed in a linear shape with respect to the transfer unit 130. Accordingly, a size of the light-emitting device 100 may be reduced as compared with a case where the electrode unit 140 is disposed in the long side direction of the substrate 110.

Further, the ΦI terminal, which is the lighting signal electrode for receiving the supply of the lighting signal ΦI that is generated by the lighting signal generation unit 220 and controls the VCSEL ij to a state of emitting light or a state of not emitting light, is disposed along the long side 110a of the substrate 110 with the light-emitting unit 120 interposed therebetween. As shown in FIG. 1, the ΦI terminal is formed along a longitudinal direction of the light-emitting unit 120, and is disposed side by side in a longitudinal direction of the electrode unit 130 and the substrate 110. Accordingly, wirings connected to the ΦI terminal and the electrode unit 130 may be brought close to each other.

In the light-emitting unit 120, 12 VCSEL groups (VCSEL groups #1 to #12) formed of 15 VCSELs are four in the x direction (first direction) and are three in the y direction (second direction) intersecting (orthogonal) with the x direction, are arranged in a 4×3 two-dimensional shape, and may be divided and irradiated. Further, an area of the light-emitting unit 120 is larger than an area of the transfer unit 130, and a light-emitting amount of the light-emitting device 100 is increased.

Therefore, in the transfer unit 130 that outputs transfer signals to the VCSEL groups arranged two-dimensionally in the first direction and the second direction, a first-direction transfer unit that outputs the transfer signal to the VCSEL group in the first direction and a second-direction transfer unit that output the transfer signal to the VCSEL group in the second direction are integrated into one unit and disposed along the short side 110*b* of the substrate 110. That is, none of the transfer units 130 are disposed in the long side direction (x direction) of the substrate 110. Accordingly, the size of the light-emitting device 100 may be reduced. (First Modification)

Figure 3:
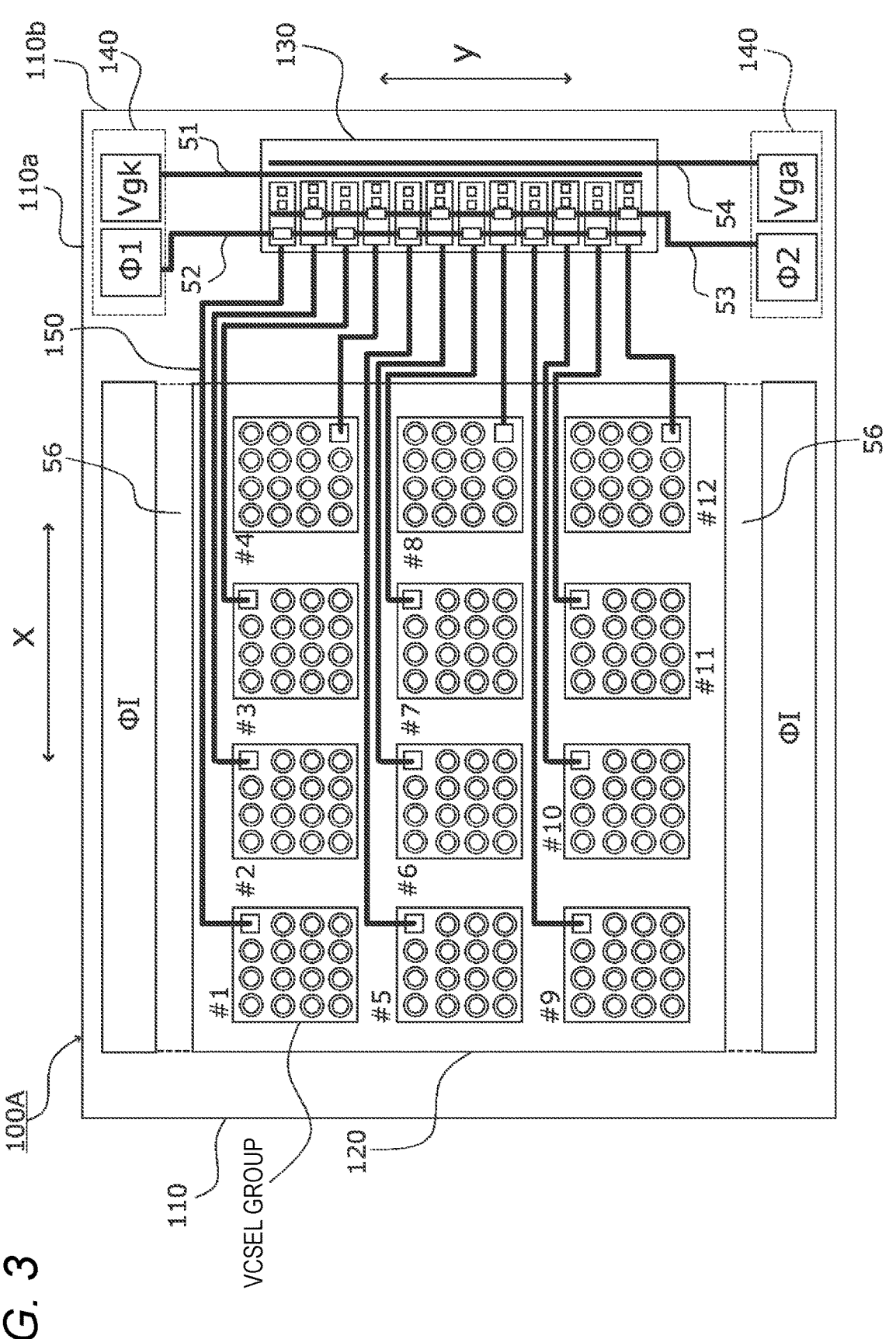
FIG. 3 is a diagram showing an example of a planar layout of a light-emitting device according to a first modification.

FIG. 3 is a diagram showing an example of a planar layout of a light-emitting device 100A according to a first modification.

As shown in FIG. 3, in the light-emitting device 100A according to the first modification, between the control unit 200 and the transfer unit 130, the $\Phi$1 terminal and the $\Phi$2 terminal for inputting and outputting the transfer signals $\Phi$1 and $\Phi$2, and the Vgk terminal and the Vga terminal for inputting and outputting the power supply potential Vgk and the reference potential Vga are disposed side by side in a direction intersecting (orthogonal) with respect to the transfer unit 130. Accordingly, a size of the light-emitting device 100 may be reduced as compared with a case where the electrode unit 140 is disposed in the long side direction of the substrate 110. (Second Modification)

Figure 4:
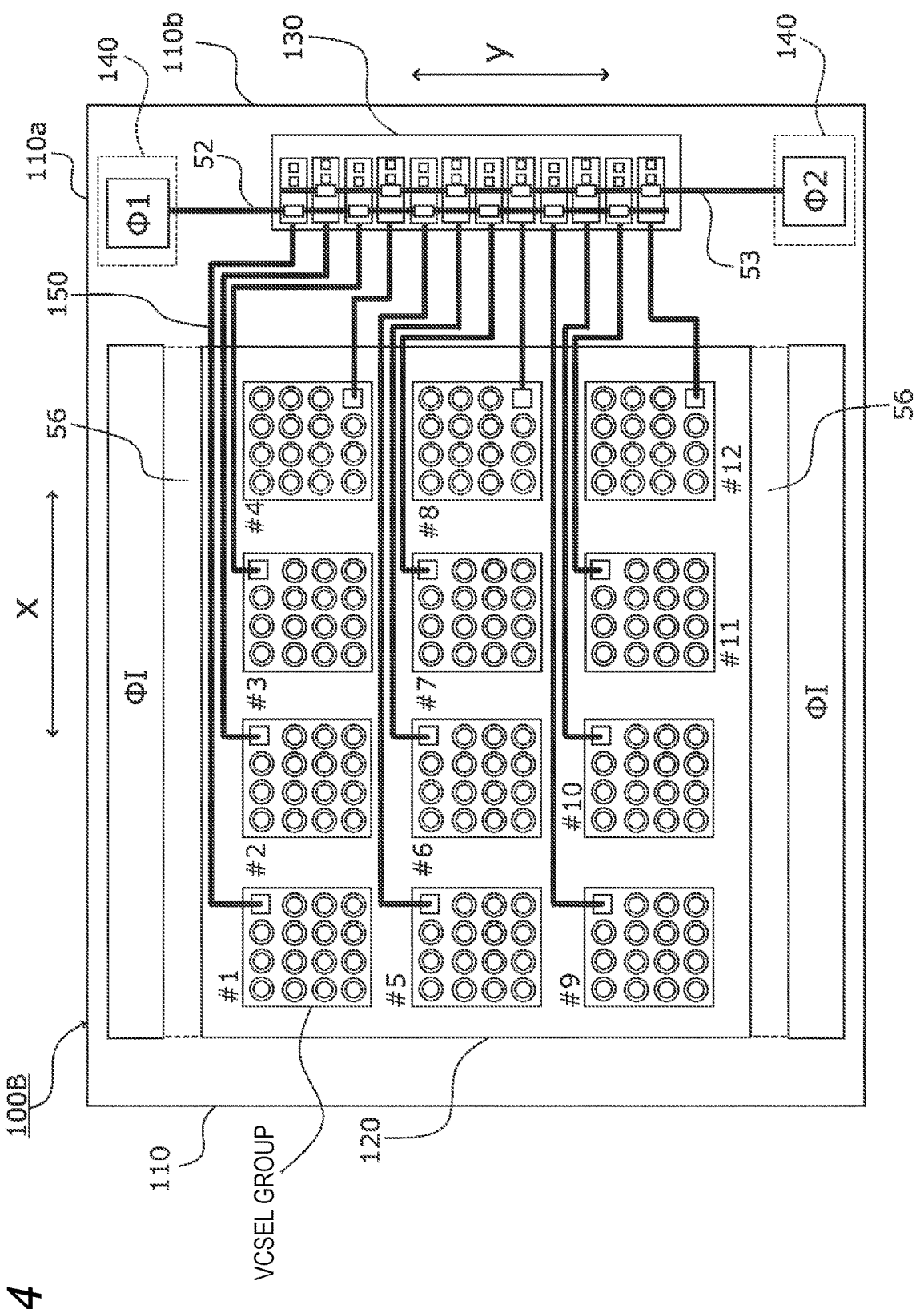
FIG. 4 is a diagram showing an example of a planar layout of a light-emitting device according to a second modification.

FIG. 4 is a diagram showing an example of a planar layout of a light-emitting device 100B according to a second modification.

In the light-emitting device 100 according to the exemplary embodiment, a case where there are the Vgk terminal and the Vga terminal for inputting and outputting the power supply potential Vgk and the reference potential Vga, including the first modification, has been described, but the Vgk terminal and the Vga terminal may be omitted. In that case, as shown in FIG. 4, between the control unit 200 and the transfer unit 130, the terminal and the $\Phi$2 terminal for inputting and outputting the transfer signals $\Phi$1 and $\Phi$2 may be disposed one by one with the transfer unit 130 interposed therebetween. Accordingly, a size of the light-emitting device 100 may be further reduced as compared with a case where the electrode unit 140 is disposed in the long side direction of the substrate 110.

Figure 5:
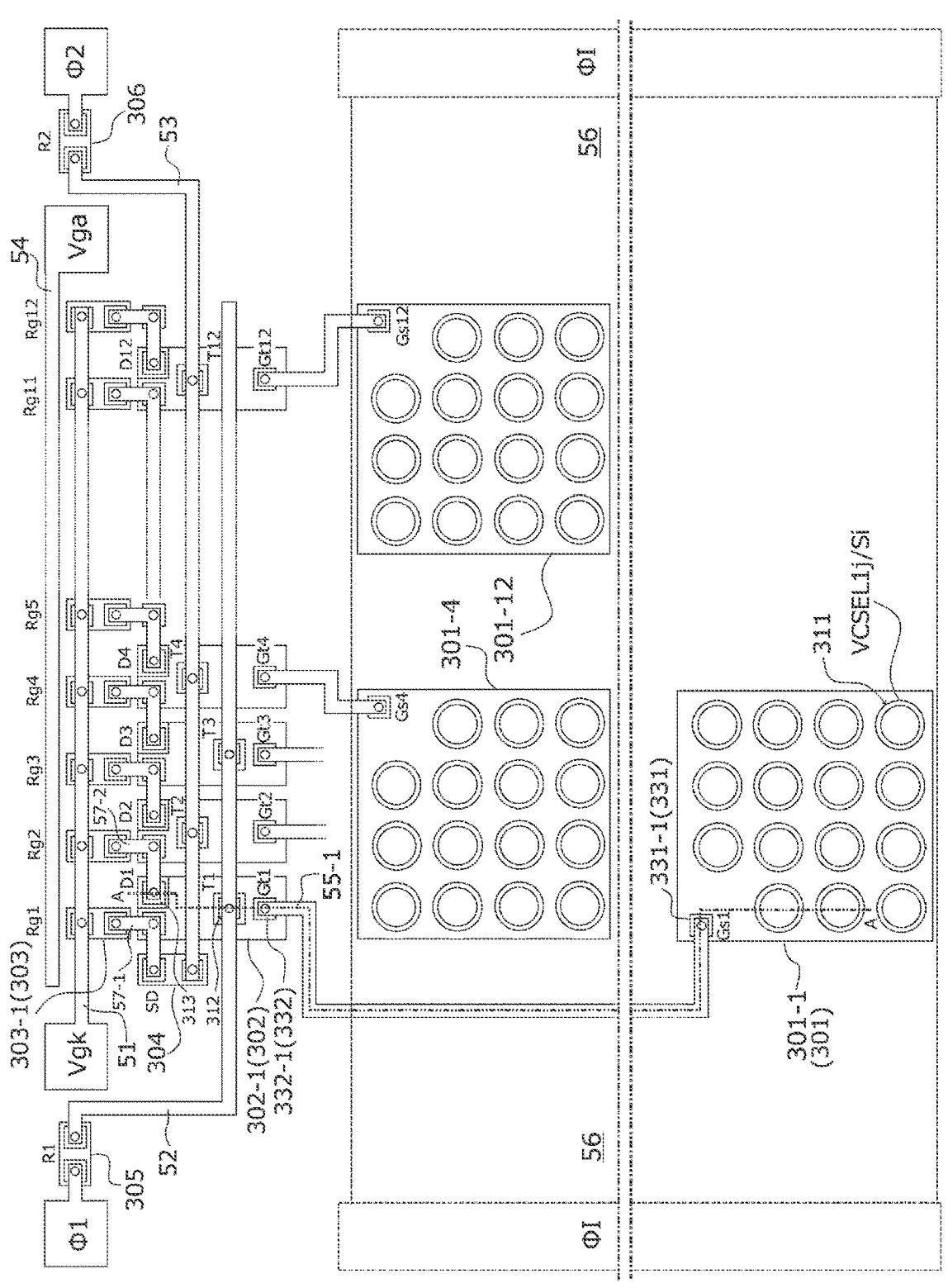
FIG. 5 is a diagram showing an example of the planar layout of the light-emitting device according to the first exemplary embodiment centering on a transfer unit.

FIG. 5 is a diagram showing an example of the planar layout of the light-emitting device 100 according to the first exemplary embodiment centering on the transfer unit 130.

The light-emitting device 100 is formed of a semiconductor material capable of emitting laser light, for example, a GaAs-based compound semiconductor. Then, as shown in a cross-sectional view described later (FIG. 6 described later), the light-emitting device 100 is formed of plural islands in which a semiconductor layer laminate where plural GaAs-based compound semiconductor layers are laminated on the p-type GaAs substrate 110 is separated between elements by mesa etching. Here, the planar layout of the light-emitting device 100 will be described with reference to islands 301 to 306 shown in FIG. 5. The islands 301, 302, and 303 are provided for each VCSEL group. Therefore, when the islands 301, 302, and 303 are distinguished for each VCSEL group, "i" may be added as described above, and the islands 301-*i*, 302-*i*, and 303-*i* may be described. In FIG. 5, i shows portions from 1 to 12. Further, the number of VCSELs in the VCSEL group is referred to as "j" as described above. Here, j is 1 to 15. Accordingly, the light-emitting device 100 is configured on a common semiconductor substrate and is miniaturized.

Figure 6:
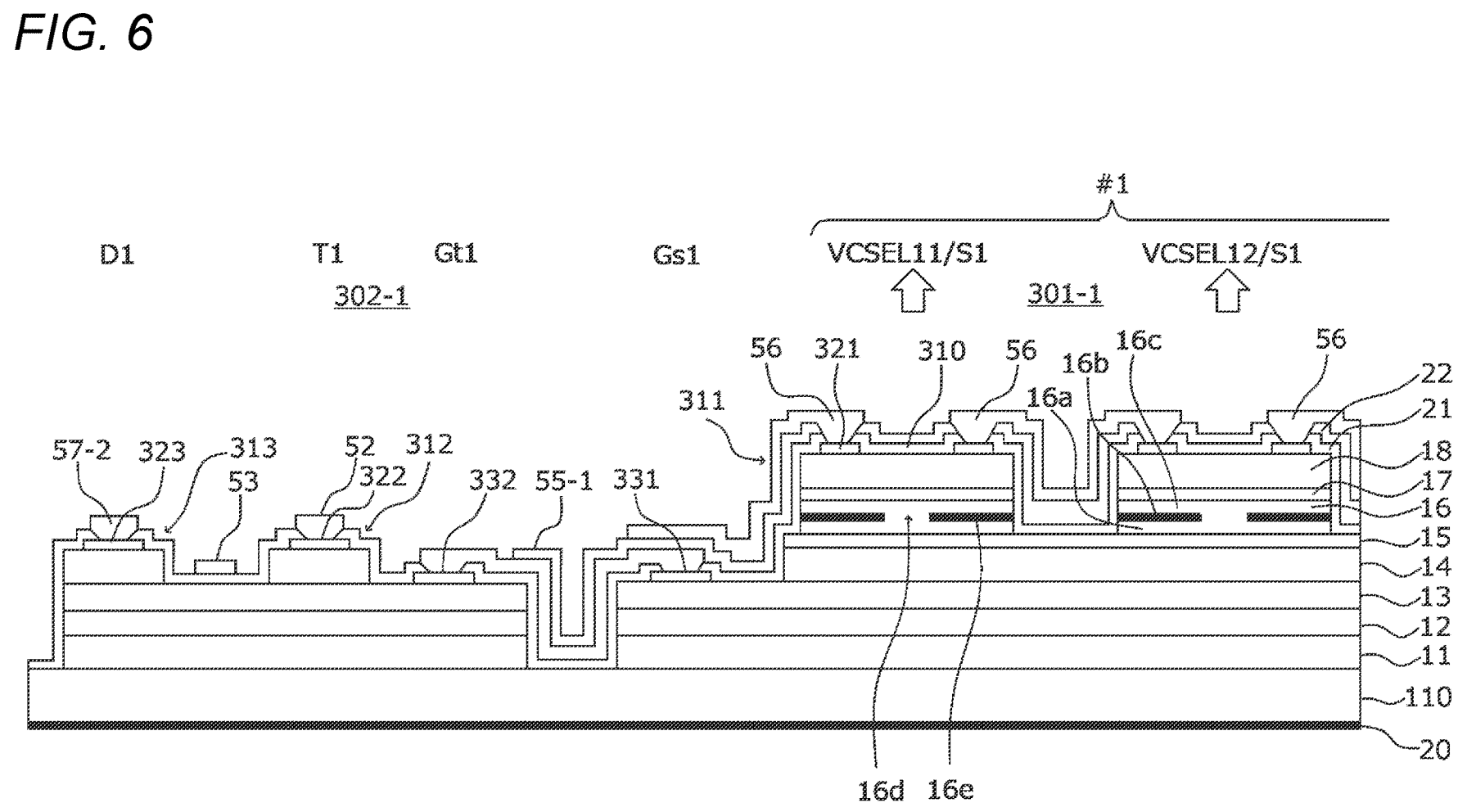

The island 301-*i* is provided with the VCSEL ij and the drive thyristor Si. As shown in FIG. 6, which will be described later, the VCSEL ij and the drive thyristor Si are laminated. In FIG. 5, the VCSEL ij and the drive thyristor Si are referred to as VCSEL ij/Si. For example, when "i" is 1, the VCSEL ij/Si is referred to as VCSEL 1*j*/S1. In FIG. 5, islands 301-1, 301-4, and 301-12 are shown, and other islands 301-*i* are omitted. 15 VCSELs are arranged on the island 301-*i*.

The island 302-*i* is provided with the transfer thyristor Ti and a coupling diode Di. The islands 302-*i* are provided so as to be parallel to each other in the y direction (short side direction).

The island 303-*i* is provided with a power supply line resistor Rgi. The islands 303-*i* are provided so as to be parallel to each other in the y direction (short side direction).

The island 304 is provided with the start diode SD. The island 305 is provided with the current limiting resistor R1, and the island 306 is provided with the current limiting resistor R2.

(1-4) Cross-Sectional Structure of Light-Emitting Device

Next, before describing a connection relationship between the islands 301 to 306, a cross-sectional structure of the islands 301 and 302 will be described.

FIG. 6 is a diagram showing a cross-sectional structure of the light-emitting device 100. FIG. 6 is a cross-sectional view of the light-emitting device 100 along a line A-A in FIG. 5. That is, the cross-sectional view shown in FIG. 6 is a cross section that crosses the coupling diode D1, the transfer thyristor T1, the VCSEL 11/S1, and the VCSEL 12/S1 from the left side on a paper surface. The parts of the island 301-1 and the island 302-1 are shown.

First, the island 301-1 provided with the drive thyristor S and the VCSEL will be described. Here, the drive thyristor S and the VCSEL are laminated (VCSEL 11/S1 and VCSEL 12/S1). As shown in FIG. 6, on the p-type GaAs substrate 110, a p-type anode layer (hereinafter referred to as a p-anode layer, and the same applies hereinafter) 11, an n-type gate layer (n-gate layer) 12, a p-type gate layer (p-gate layer) 13, and an n-type cathode layer (n-cathode layer) 14 forming the drive thyristor Si are laminated. That is, the drive thyristor S includes the p-anode layer 11 as an anode, the n-gate layer 12 as an n-gate, the p-gate layer 13 as a p-gate, and the n-cathode layer 14 as a cathode.

Next, a tunnel junction layer 15 is laminated on the n-cathode layer 14. Then, a p-type anode layer (p-anode layer) 16, a light-emitting layer 17, and an n-type cathode layer (n-cathode layer) 18 forming the VCSEL 11 and the VCSEL 12 are laminated on the tunnel junction layer 15. That is, the VCSEL includes the p-anode layer 16 as an anode, the light-emitting layer 17 as a light-emitting layer, and the n-cathode layer 18 as a cathode.

The drive thyristor S1, the VCSEL 11, and the VCSEL 12 are connected in series via the tunnel junction layer 15. The tunnel junction layer 15 will be described later.

In the parts of the VCSEL 11 and the VCSEL 12, the n-cathode layer 18, the light-emitting layer 17, and the p-anode layer 16 are removed by etching such that the tunnel junction layer 15 around the VCSEL is exposed. Here, a cross-sectional shape of the VCSEL is circular. That is, the part of the VCSEL is formed in a columnar shape. Therefore, the part of the VCSEL is referred to as a post 311 (see FIG. 5).

The p-anode layer 11, the n-gate layer 12, the p-gate layer 13, the n-cathode layer 14, and the tunnel junction layer 15 forming the drive thyristor S are continuous between the VCSELs belonging to the VCSEL group #1.

Further, in the island 301-1, in a portion where the tunnel junction layer 15 and the n-cathode layer 14 are further removed to expose the p-gate layer 13, a p-ohmic electrode 331 made of a metal material that easily forms ohmic contact with a p-type semiconductor layer such as the p-gate layer 13 is provided as a gate Gs1 of the drive thyristor S1.

On the n-cathode layer 18 of the VCSEL, an n-ohmic electrode 321 made of a metal material that easily forms ohmic contact with an n-type semiconductor layer such as the n-cathode layer 18 is provided. The n-ohmic electrode 321 is provided in a circular shape so as to surround the light-emitting port 310 (see FIG. 5).

The p-anode layer 16 of the post 311 includes a current constriction layer 16b. Here, as an example, the p-anode layer 16 includes three layers, that is, a lower p-anode layer 16a, a current constriction layer 16b, and an upper p-anode layer 16c. The current constriction layer 16b is made of a material having a high Al composition ratio, such as AlAs, and refers to a layer in which a portion (black-painted portion in FIG. 6) is formed. In the portion, Al becomes $Al_2O_3$ due to oxidation, such that electrical resistance increases and a current does not easily flow.

Since the post 311 is provided in a columnar shape, when the current constriction layer 16b is oxidized from a side surface of the exposed p-anode layer 16, the oxidation proceeds from a peripheral portion to a central portion in a circular cross section. Then, by not oxidizing the central portion, the central portion in the cross section of the VCSEL is a current passing region 16d where the current easily flows, and the peripheral portion is a current blocking region 16e where the current does not easily flow. The VCSEL emits light in a portion where a current path is limited by the current passing region 16d of the light-emitting layer 17. A region on the surface of the VCSEL corresponding to the current passing region 16d is a light-emitting point, and is the light-emitting port 310.

The current constriction layer 16b is provided in order to oscillate the VCSEL in the low-order single-transverse mode (single-mode). That is, by making a cross-sectional shape of the post 311 on which the VCSEL is formed circular and oxidizing the post 311 from the peripheral portion, a cross-sectional shape of the light-emitting port 310 is made circular and the area is reduced.

Further, the peripheral portion of the VCSEL has many defects due to mesa etching, and non-light-emitting recombination is likely to occur. Therefore, by providing the current blocking region 16e, a power consumed for non-light-emitting recombination is prevented. Therefore, it is possible to reduce the power consumption and improve the light extraction efficiency. The light extraction efficiency is a light amount that can be extracted per power.

Next, the island 302-1 provided with the transfer thyristor T1 and the coupling diode D1 will be described. Like the drive thyristor S, the transfer thyristor T1 includes the p-anode layer 11, the n-gate layer 12, the p-gate layer 13, and the n-cathode layer 14. That is, the transfer thyristor T1 includes the p-anode layer 11 as the anode, the n-gate layer 12 as the n-gate, the p-gate layer 13 as the p-gate, and the n-cathode layer 14 as the cathode. Here, a gate electrode (p-ohmic electrode 332, which will be described later) is provided on the p-gate layer 13.

The coupling diode D1 includes the p-gate layer 13 and the n-cathode layer 14. That is, the coupling diode D1 includes the p-gate layer 13 as an anode and the n-cathode layer 14 as a cathode.

In the island 302-1, the n-cathode layer 18, the light-emitting layer 17, the p-anode layer 16, and the tunnel junction layer 15 in a portion where the drive thyristor S and the VCSEL are laminated are removed. Then, in the part of the transfer thyristor T1 and the part of the coupling diode D1, the n-cathode layer 14 is removed such that the n-cathode layer 14 remains as a post 312 and a post 313.

An n-ohmic electrode 322 is provided on the n-cathode layer 14 of the post 312 as a cathode electrode of the transfer thyristor T1. Similarly, an n-ohmic electrode 323 is provided on the n-cathode layer 14 of the post 313 as the cathode electrode of the coupling diode D1.

The p-ohmic electrode 332 provided on the p-gate layer 13 functions as the gate Gt1 of the transfer thyristor T1 and the anode electrode of the coupling diode D1.

Then, an interlayer insulating layer 21 is provided so as to cover the surface. On the interlayer insulating layer 21, a signal line 55 for connecting the p-ohmic electrode 331 (gate Gs1) provided on the island 301-1 and the p-ohmic electrode 332 (gate Gt1) provided on the island 302-1 is provided via a through hole. Further, the transfer signal line 52 connected to the n-ohmic electrode 322 is provided on the interlayer insulating layer 21. The transfer signal line 53 is provided on the interlayer insulating layer 21. Further, on the interlayer insulating layer 21, a wiring 54-2 connected to the n-ohmic electrode 323 is provided via a through hole.

Further, an interlayer insulating layer 22 is provided so as to cover the surface. Then, on the interlayer insulating layer 22, the lighting signal line 56 connected to the n-ohmic electrode 321 provided on the island 301-1 is provided through the through holes provided in the interlayer insulating layer 22 and the interlayer insulating layer 21. That is, the signal line 55 and the lighting signal line 56 have a multi-layer wiring structure via the interlayer insulating layer 22.

When the interlayer insulating layers 21 and 22 are inferior in transparency to the emitted light of the VCSEL, instead of the interlayer insulating layers 21 and 22 on the light-emitting port 310, a light-emitting layer having excellent transparency to the emitted light of the VCSEL may be provided.

The islands 301, 302, 303, 304, 305, and 306 are separated from each other by removing the surrounding semiconductor layer laminate by etching up to the substrate 110. The semiconductor layer laminate may be etched up to the p-anode layer 11, or may be etched up to a part of the p-anode layer 11 in a thickness direction.

Returning to FIG. 5, the other islands 303, 304, 305, and 306 will be described. The power supply line resistor Rg1 is configured on the island 303. In the island 303-1, the n-cathode layer 18, the light-emitting layer 17, the p-anode layer 16, the tunnel junction layer 15, and the n-cathode layer 14 in the semiconductor layer laminate are removed to expose the p-gate layer 13. A pair of p-ohmic electrodes are provided on the exposed p-gate layer 13. The p-gate layer 13 between the p-ohmic electrodes is used as a resistor.

The island 304 is provided with the start diode SD. In the island 304, the n-cathode layer 18, the light-emitting layer 17, the p-anode layer 16, and the tunnel junction layer 15 in the semiconductor layer laminate are removed. Then, the p-gate layer 13 is exposed except for a post 314 in which the n-cathode layer 14 remains. In the start diode SD, the n-cathode layer 14 forming the post 314 is a cathode, and the p-gate layer 13 is an anode. Then, the n-ohmic electrode provided on the n-cathode layer 14 of the post 314 is a cathode electrode, and the p-ohmic electrode provided on the exposed p-gate layer 13 is an anode electrode.

The island 305 is provided with the current limiting resistor R1, and the island 306 is provided with the current limiting resistor R2. The islands 305 and 306 have the same configuration as the island 303, and the p-gate layers 13 between the pair of p-ohmic electrodes provided on the exposed p-gate layer 13 are the current limiting resistors R1 and R2, respectively.

The islands 301 to 306 and the connection relationship between the islands will be described.

As described above, the n-cathode layer 18, which is the cathode of the VCSEL provided on the post 311 of the island 301-1, is connected in parallel to the lighting signal line 56 via the n-ohmic electrode 321. The same applies to the other islands 301.

The n-cathode layer 18, which is the cathode of the transfer thyristor T1 provided on the post 312 of the island 302-1, is connected to the transfer signal line 52 via the n-ohmic electrode 322. The same applies to the transfer thyristor T3 provided on the island 302-3. That is, the cathode (n-cathode layer 18) of the transfer thyristor Ti having an odd number i is connected to the transfer signal line 52.

On the other hand, the cathode (n-cathode layer 18) of the transfer thyristor T2 provided on the island 302-2 is connected to the transfer signal line 53. That is, the cathode (n-cathode layer 18) of the transfer thyristor Ti having an even number i is connected to the transfer signal line 53.

Then, the p-ohmic electrode 331, which is the gate Gs1 of the island 301-1, and the p-ohmic electrode 332, which is the gate Gt1 of the island 302-1, are connected by a signal line 55-1. The cathode (n-cathode layer 18) of the coupling diode D1 provided on the post 313 of the island 302-1 is connected to a wiring 57-2 via the n-ohmic electrode 323. The wiring 57-2 is connected to the p-ohmic electrode of the adjacent island 302-2 and the p-ohmic electrode of the power supply line resistor Rg2 of the island 303-2.

A signal from the signal line 55-1 is transmitted not only to plural VCSELs 11 but also to the VCSELs of the #1 group such as the VCSEL 12. A signal line corresponding to the signal line 55-1 is provided for each light-emitting element group, and the signal line 55-1 is a common signal line.

A p-ohmic electrode 333 provided on the island 302-1 (provided on the p-gate layer 13 in the same manner as the p-ohmic electrode 332 of the gate Gt1), one p-ohmic electrode of the power supply line resistor Rg1 provided on the island 303-1, and the n-ohmic electrode, which is the cathode electrode of the start diode SD provided on the island 304, are connected by a wiring 57-1.

Further, the other p-ohmic electrode of the power supply line resistor Rg1 of the island 303-1 is connected to the power supply line 51. The power supply line 51 is connected to the Vgk terminal. The same applies to the other islands 303.

The transfer signal line 52 is connected to one p-ohmic electrode of the current limiting resistor R1 of the island 305. The other p-ohmic electrode of the current limiting resistor R1 is connected to the Φ1 terminal. The transfer signal line 53 is connected to the p-ohmic electrode of the start diode SD of the island 303 and is connected to one p-ohmic electrode of the current limiting resistor R2 of the island 306. The other p-ohmic electrode of the current limiting resistor R2 of the island 306 is connected to the Φ2 terminal.

In the above, the islands 301-1, 302-1, and 303-1 have been described as examples, but the same applies to the other islands 301, 302, and 303.

(1-5) Operation of Light-Emitting Device (1-5.1) Thyristor

Next, operations of the drive thyristor S and the transfer thyristor T will be described. The drive thyristor S and the transfer thyristor T are integrally referred to as a thyristor.

The thyristor is formed by laminating the p-anode layer 11, the n-gate layer 12, the p-gate layer 13, and the n-cathode layer 14. As described above, the thyristor is a semiconductor element having three terminals of an anode, a cathode, and a gate, and for example, is formed by laminating the p-type semiconductor layer (the p-anode layer 11 and the p-gate layer 13) and the n-type semiconductor layer (the n-gate layer 12 and the n-cathode layer 14) made of GaAs, GaAlAs, AlAs, or the like. That is, the thyristor has a pnpn structure. Here, as an example, a forward potential (diffusion potential) Vd of a pn junction formed of the p-type semiconductor layer and the n-type semiconductor layer is 1.5 V.

As an example, the reference potential Vga of the p-anode layer 11 is 0 V as a high-level potential (hereinafter referred to as "H"), and the power supply potential Vgk supplied to the Vgk terminal (see FIG. 2) is −3.3 V as a low-level potential (hereinafter referred to as "L"). Therefore, the potentials may be described as "H (0 V)" and "L (−3.3 V)". As shown in FIG. 2, the Vgk terminal is connected to a gate (the gate Gt1 when the thyristor is the transfer thyristor T1) via the power supply line resistor Rg1.

A thyristor in an off state in which no current flows between the anode and the cathode changes to an on state (turns on) when a potential lower than a threshold voltage (a negative potential having a large absolute value) is applied to the cathode. Here, the threshold voltage of the thyristor is a value obtained by subtracting the forward potential Vd (1.5 V) of the pn junction from the potential of the gate.

When the thyristor is brought into the on state, the gate of the thyristor has a potential close to that of the anode. Here, since the anode is 0 V, the gate is 0 V. Further, the cathode of the thyristor in the on state has a potential close to the potential obtained by subtracting the forward potential Vd (1.5 V) of the pn junction from the potential of the anode (the absolute value is referred to as a holding voltage). Here, since the anode is 0 V, the cathode of the thyristor in the on state has a potential close to −1.5 V (a negative potential whose absolute value is larger than 1.5 V). Here, the holding voltage is assumed to be 1.5 V.

When a potential (a negative potential whose absolute value is large) lower than a potential required to maintain the on state is continuously applied to the cathode and a current capable of maintaining the on state (maintenance current) is supplied to the cathode, the thyristor in the on state maintains the on state.

On the other hand, when the potential (a negative potential whose absolute value is small, 0 V, or a positive potential) is higher than the potential (the potential close to −1.5 V) required for the cathode to maintain the on state, the thyristor in the on state changes to the off state (turns off).

(1-5.2) Operations of Laminated Drive Thyristors and VCSEL

Next, operations of the laminated drive thyristors S and the VCSEL will be described.

Here, the VCSEL has a rising voltage of 1.5 V. That is, if a voltage of 1.5 V or more is applied between the anode and the cathode of the VCSEL, the VCSEL emits light. It is assumed that the lighting signal $\Phi I$ is 0 V ("H (0 V)") or –3.3 V ("L (–3.3 V)"). 0 V is a potential that brings the VCSEL into the off state, and –3.3 V is a potential that brings the VCSEL from the off state into the on state.

When the VCSEL is changed from the off state to the on state, the lighting signal $\Phi I$ is set to "L (–3.3 V)". At this time, when –1.5 V is applied to the gate Gs of the drive thyristor S, a threshold of the drive thyristor S is –3 V, which is obtained by subtracting the forward potential Vd (1.5 V) of the pn junction from a potential (–1.5 V) of the gate Gs. At this time, since the lighting signal $\Phi I$ is –3.3 V, the drive thyristor S turns on and changes from the off state to the on state, and the VCSEL also changes from the off state to the on state. That is, the VCSEL oscillates by a laser and emits light. Then, since a voltage (holding voltage Vr) applied to the drive thyristor S in the on state is 1.5 V, 1.8 V is applied to the VCSEL. Since the VCSEL has the rising voltage of 1.5 V, the VCSEL continues to emit light.

On the other hand, when the lighting signal $\Phi I$ is 0 V, both ends of series connection between the drive thyristor S and the VCSEL become 0 V, the drive thyristor S changes from the on state to the off state (turns off), and the VCSEL does not emit light.

(1-6) Measurement Device

The light-emitting device 100 according to the first exemplary embodiment described above may be used for light measurement.

Figure 7:
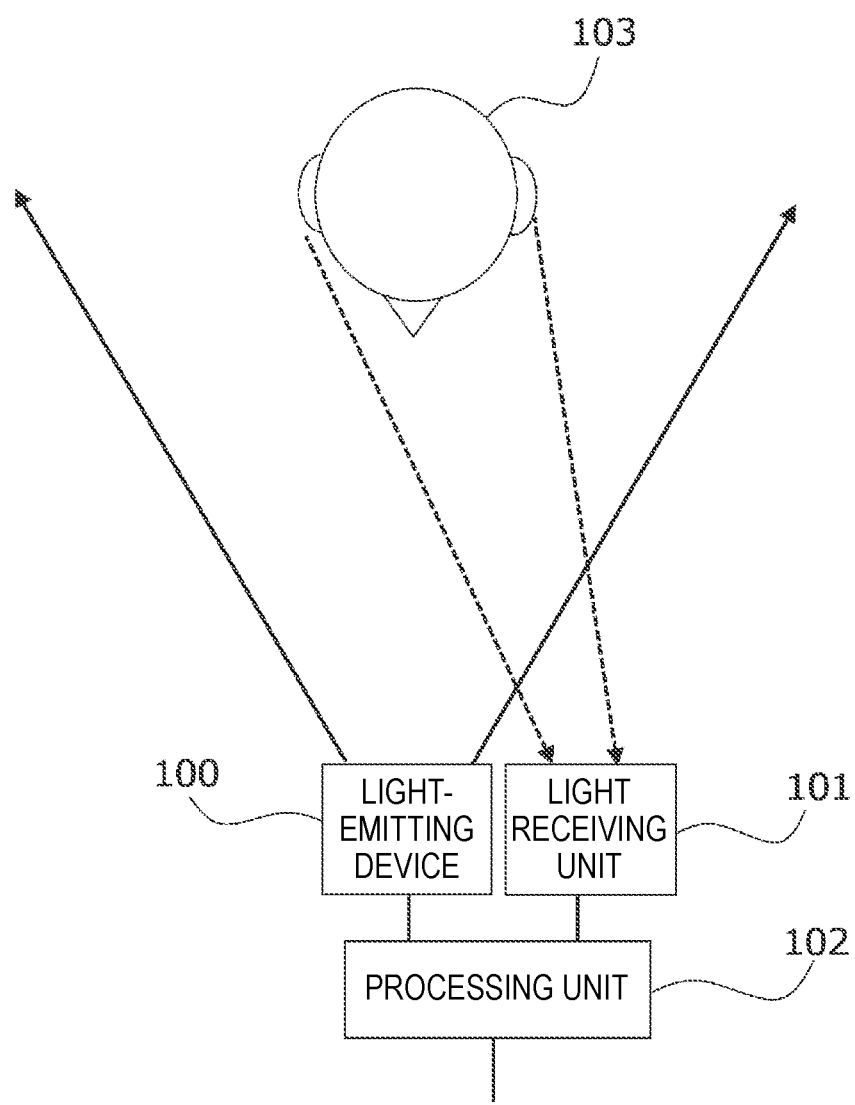
FIG. 7 is a diagram illustrating a measurement device using the light-emitting device.

FIG. 7 is a diagram illustrating a measurement device 1 using the light-emitting device 100.

The measurement device 1 includes the above light-emitting device 100, a light receiving unit 101 that receives light, and a processing unit 102 that processes data. Then, a measurement object (object) 103 is placed facing the measurement device 1. In FIG. 7, the measurement object 103 is a person as an example, and FIG. 7 is a view seen from above.

The light-emitting device 100 lights the VCSEL groups disposed two-dimensionally as described above, and emits light that spreads in a conical shape around the light-emitting device 100 as shown by solid lines.

The light receiving unit 101 is a device that receives light reflected by the measurement object 103. The light receiving unit 101 receives light directed to the light receiving unit 101 as shown by broken lines. The light receiving unit 101 is preferably an image-capturing device that receives light from a two-dimensional direction.

The processing unit 102 is configured as a computer including an input and output unit for inputting and outputting data. Then, the processing unit 102 processes information about the light to calculate a distance to the measurement object 103 and a three-dimensional shape of the measurement object 103.

The processing unit 102 of the measurement device 1 controls the light-emitting device 100 to emit light from the light-emitting device 100 in a short period of time. That is, the light-emitting device 100 emits light in a pulsed manner, and the processing unit 102 calculates, based on a time difference between a time point when the light-emitting device 100 emits the light and a time point when the light receiving unit 101 receives the reflected light from the measurement object 103, an optical path length from when the light is emitted from the light-emitting device 100 to when the light is reflected by the measurement object 103 and reaches the light receiving unit 101. Positions of the light-emitting device 100 and the light receiving unit 101 and an interval therebetween are predetermined. Therefore, the processing unit 102 measures a distance to the measurement object 103 based on a distance from the light-emitting device 100 and the light receiving unit 101 or a point serving as a reference (hereinafter, referred to as a reference point). The reference point is a point provided at a predetermined position from the light-emitting device 100 and the light receiving unit 101.

The method is a measurement method based on an arrival time of light, and is called a time-of-flight (TOF) method.

If the method is performed on plural points on the measurement object 103, a three-dimensional shape of the measurement object 103 is measured. As described above, the light emitted from the light-emitting device 100 spreads two-dimensionally and is radiated to the measurement object 103. Then, reflected light from a portion of the measurement object 103 having a short distance from the light-emitting device 100 is quickly incident on the light receiving unit 101. When the above image-capturing device that obtains a two-dimensional image is used, a bright spot is recorded in a portion of a frame image where the reflected light reaches. An optical path length is calculated for each bright spot based on bright spots recorded in a series of frame images. Then, the distance from the light-emitting device 100 and the light receiving unit 101 or a distance from the reference point is calculated. Accordingly, a three-dimensional shape of the measurement object 103 is calculated.

Alternatively, the light-emitting device 100 of the first exemplary embodiment can also be used in a light measurement method using a structured light method. The device to be used is substantially the same as the measurement device 1 using the light-emitting device 100 shown in FIG. 9. A difference is that a pattern of the light with which the measurement object 103 is irradiated is an infinite number of light dots (a random pattern), and the light receiving unit 101 receives the light dots.

Then, the processing unit 102 processes information on the light. Here, as a method of processing, the distance to the measurement object 103 and the three-dimensional shape of the measurement object 103 are calculated by calculating a positional deviation amount of the infinite number of light dots, instead of obtaining the time difference described above.

In the related art, as a light source used in this method, a randomly disposed two-dimensional VCSEL array or the like is used, but the random pattern to be irradiated is about 1 to 4 predetermined patterns (structured light Fix method). On the other hand, since the light-emitting device 100 of the first exemplary embodiment can freely set, by a signal from the outside, the light dots to be irradiated, it is possible to irradiate more random patterns with light (structured light programmable method).

The measurement device 1 as described above may be applied to calculation of a distance from an article. Further, the measurement device 1 may calculate a shape of the article and may be applied to identification of the article. Then, the measurement device 1 may calculate a shape of a face of a person, and may be applied to face recognition. Further, the measurement device 1 may be applied to detection of an obstacle on a front side, a rear side, a lateral side, or the like by being mounted on a vehicle. As described above, the measurement device 1 may be widely used for calculating a distance, a shape, or the like.

In the above first exemplary embodiment, an example in which the light-emitting device 100 is used for measurement has been described, but the invention is not limited thereto. As a light-emitting device for light transmission, the light-emitting device may be used together with a light transmission path, or as a light-emitting device for biometric recognition, the light-emitting device may be a light-emitting device that emits light toward the inside of an object.

In the above exemplary embodiment, the VCSEL group is configured such that the light-emitting elements in the same group are adjacent to each other. Accordingly, a region of the VCSEL group is not dispersed, and a configuration such as simplification of the common signal line becomes easy. In that case, since the light-emitting elements connected to the same common signal line can be regarded as one light-emitting group, the region of the VCSEL group is dispersed and the shape of the VCSEL group may not be divided into beautiful partitions.

In the above exemplary embodiment, in the transfer thyristor T1, the on state propagates in order. Accordingly, the transfer thyristor Ti describes an example in which the VCSEL group is sequentially lighted up, but the transfer thyristor Ti further includes a memory unit. In the transfer thyristor Ti, after the on state propagates in order, signals are temporarily stored in the memory unit, and by transmitting the signals to the plural VCSEL groups at the same time, the plural VCSEL groups may be configured to light up all at once.

(2-1) Overall Configuration of Light-Emitting Device

Figure 8:
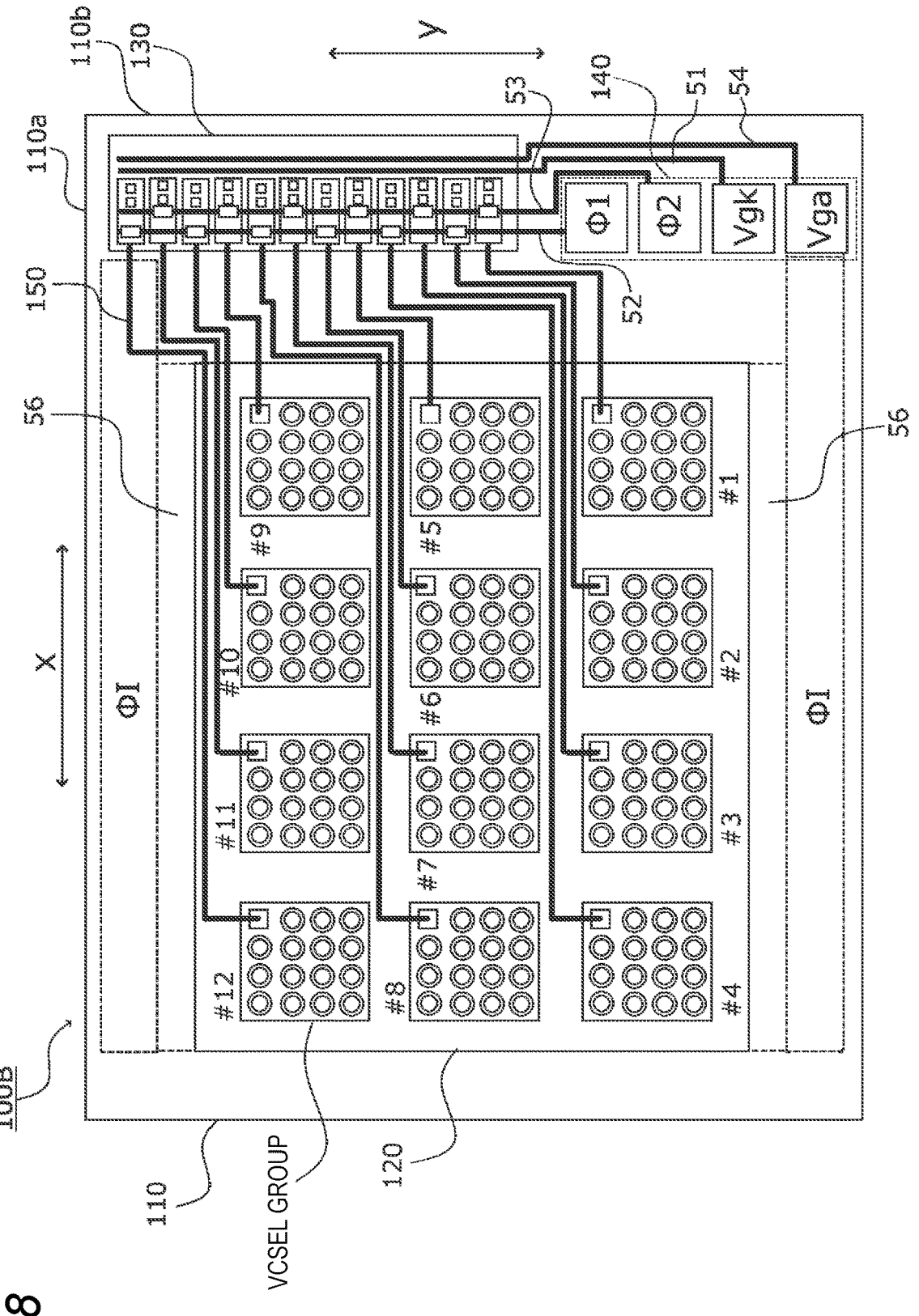
FIG. 8 is a diagram showing an example of a planar layout of a light-emitting device according to a second exemplary embodiment.
Figure 9:
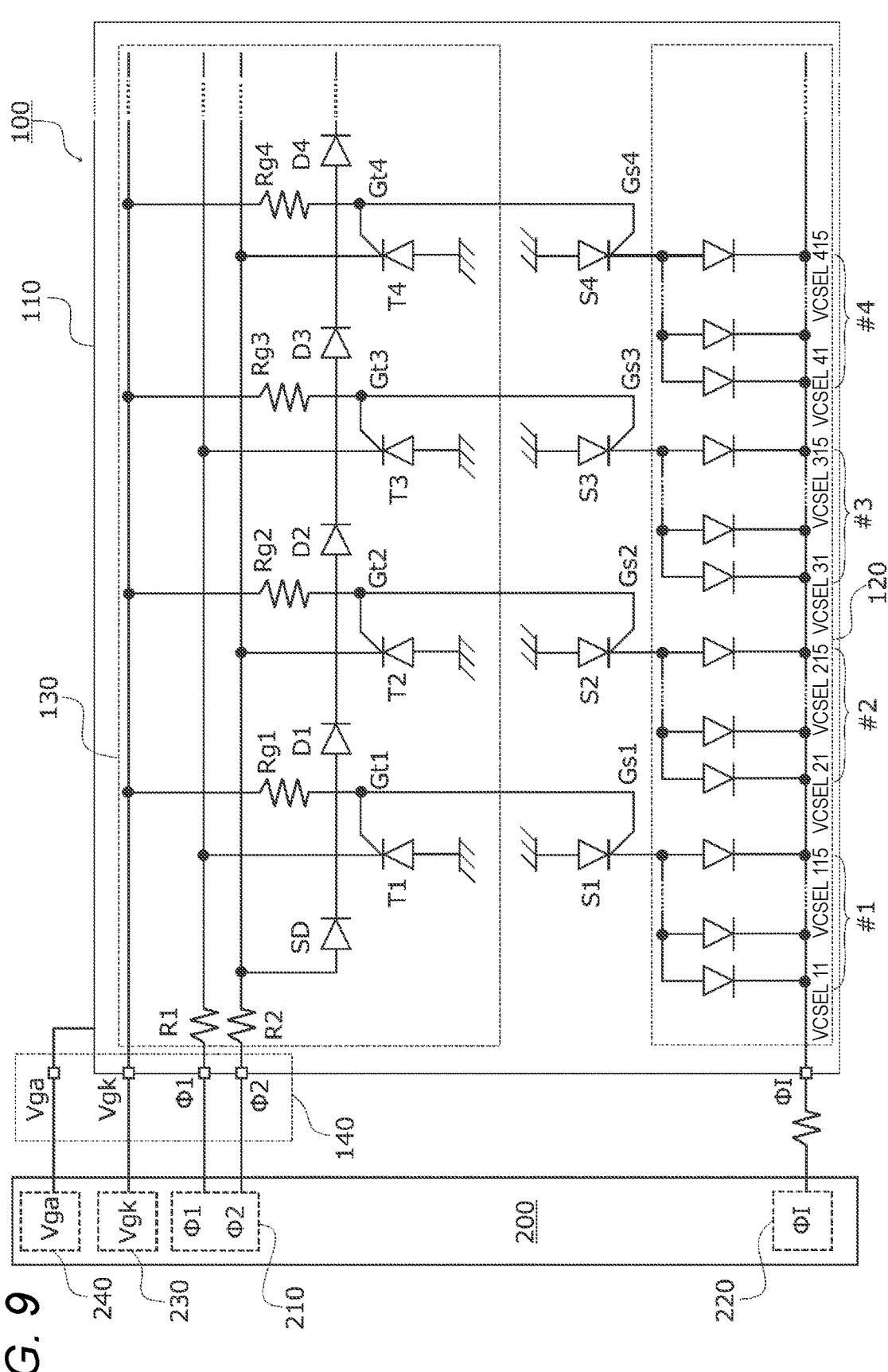
FIG. 9 is a schematic equivalent circuit diagram of the light-emitting device according to the second exemplary embodiment.

FIG. 8 is a diagram showing an example of a planar layout of the light-emitting device 100 according to a second exemplary embodiment, and FIG. 9 is a schematic equivalent circuit diagram of the light-emitting device 100 according to the second exemplary embodiment. In FIG. 9, the control unit 200 that controls the light-emitting device 100 is also shown.

As shown in FIG. 8, the light-emitting device 100 of the second exemplary embodiment includes the substrate 110, the light-emitting unit 120 including plural light-emitting elements, the transfer unit 130 that controls light-emitting of the light-emitting elements, the electrode unit 140 formed of plural terminals for capturing a signal for driving the transfer unit 130, and the common signal line 150 that connects the light-emitting unit 120 and the transfer unit 130 to each other.

The light-emitting unit 120 as an example of the light-emitting element includes plural laser diodes that emit laser light. Then, the light-emitting device 100 is configured as a self-scanning light-emitting device (SLED) as described below. In the second exemplary embodiment, the laser diode is, for example, a vertical cavity surface emitting laser (VCSEL). In the following, the light-emitting element will be described as a VCSEL, but other light-emitting devices such as a light-emitting diode LED may be used.

(2-2) Equivalent Circuit of Light-Emitting Device

Since all the descriptions of the above "(1-2) equivalent circuit of light-emitting device" are also applied to the light-emitting device 100 according to the second exemplary embodiment, the description will be omitted. However, in the above description of "(1-2) equivalent circuit of light-emitting device", "FIG. 1" is read as "FIG. 8", "FIG. 2" is read as "FIG. 9", and "FIG. 3" is read as "FIG. 10", and the description can be applied to the light-emitting device 100 according to the second exemplary embodiment.

(2-3) Planar Layout of Light-Emitting Device

Returning to FIG. 8, first, a planar layout of the transfer unit 130 and the electrode unit 140 in the light-emitting device 100 according to the second exemplary embodiment will be described. The substrate 110 of the light-emitting device 100 has a rectangular shape having the long side 110a and the short side 110b, and in FIG. 8, an x direction is a long side direction and a y direction is a short side direction.

As shown in FIG. 8, the transfer unit 130 and the electrode unit 140 are disposed along the short side 110b of the substrate 110, respectively.

The electrode unit 140 includes the Φ1 terminal and the Φ2 terminal as the transfer signal electrodes for receiving the supply of the transfer signals Φ1 and Φ2 generated by the transfer signal generation unit 210 of the control unit 200, the Vgk terminal as the power supply electrode for receiving the supply of the power supply potential Vgk generated by the power supply potential generation unit 230, and the Vga terminal as the power supply electrode for receiving the supply of the reference potential Vga generated by the reference potential generation unit 240. Each terminal is a bonding pad.

The transfer signal line 52 extending from the Φ1 terminal of the electrode unit 140, the transfer signal line 53 extending from the Φ2 terminal, the power supply line 51 extending from the Vgk terminal, and the reference potential line 54 extending from the Vga terminal are formed as a conductive pattern in the transfer unit 130 of the light-emitting device 100.

In the transfer unit 130, the cathodes of the odd-numbered transfer thyristors Ti, T3, . . . are connected to the transfer signal line 52, and the cathodes of the even-numbered transfer thyristors T2, T4, . . . are connected to the transfer signal line 53.

Accordingly, as shown in FIG. 8, between the control unit 200 and the transfer unit 130, the Φ1 terminal and the Φ2 terminal for inputting and outputting the transfer signals Φ1 and 12, and the Vgk terminal and the Vga terminal for inputting and outputting the power supply potential Vgk and the reference potential Vga are disposed side by side along the short side 110b of the substrate 110. Accordingly, a length of the substrate 110 in the longitudinal direction may be shortened as compared with a case where the electrode unit 140 is disposed in the long side direction of the substrate 110.

Further, the ΦI terminal, which is the lighting signal electrode for receiving the supply of the lighting signal ΦI that is generated by the lighting signal generation unit 220 and controls the VCSEL ij to a state of emitting light or a state of not emitting light, is disposed along the long side 110a of the substrate 110 with the light-emitting unit 120 interposed therebetween such that there is a portion where the transfer unit 130 and the substrate 110 overlap in the short side direction. Then, the other ΦI terminal is disposed such that there is a portion where the electrode unit 140 and the substrate 110 overlap in the short side direction. Accordingly, the length of the substrate 110 in the longitudinal direction may be further shortened.

In the light-emitting unit 120, 12 VCSEL groups (VCSEL groups #1 to #12) formed of 15 VCSELs are four in the x direction (first direction) and are three in the y direction (second direction) intersecting (orthogonal) with the x direction, and are arranged in a 4×3 two-dimensional shape. That is, the number (4 in the second exemplary embodiment) of VCSEL groups arranged along the long side direction of the substrate 110 is arranged to be larger than the number (3 in the second exemplary embodiment) of VCSEL groups arranged along the short side direction of the substrate 110. Accordingly, the light-emitting device 100 may perform divided irradiation and may widen an irradiation region in the horizontal direction (x direction).

Further, an area of the light-emitting unit 120 is larger than an area of the transfer unit 130, and a light-emitting amount of the light-emitting device 100 is increased.

Therefore, in the transfer unit 130 that outputs transfer signals to the VCSEL groups arranged two-dimensionally in the first direction and the second direction, a first-direction transfer unit that outputs the transfer signal to the VCSEL group in the first direction and a second-direction transfer unit that output the transfer signal to the VCSEL group in the second direction are integrated into one unit and disposed along the short side 110*b* of the substrate 110. That is, none of the transfer units 130 are disposed in the long side direction (x direction) of the substrate 110. Accordingly, the length of the substrate 110 in the longitudinal direction may be shortened.

(Modification)

Figure 10:
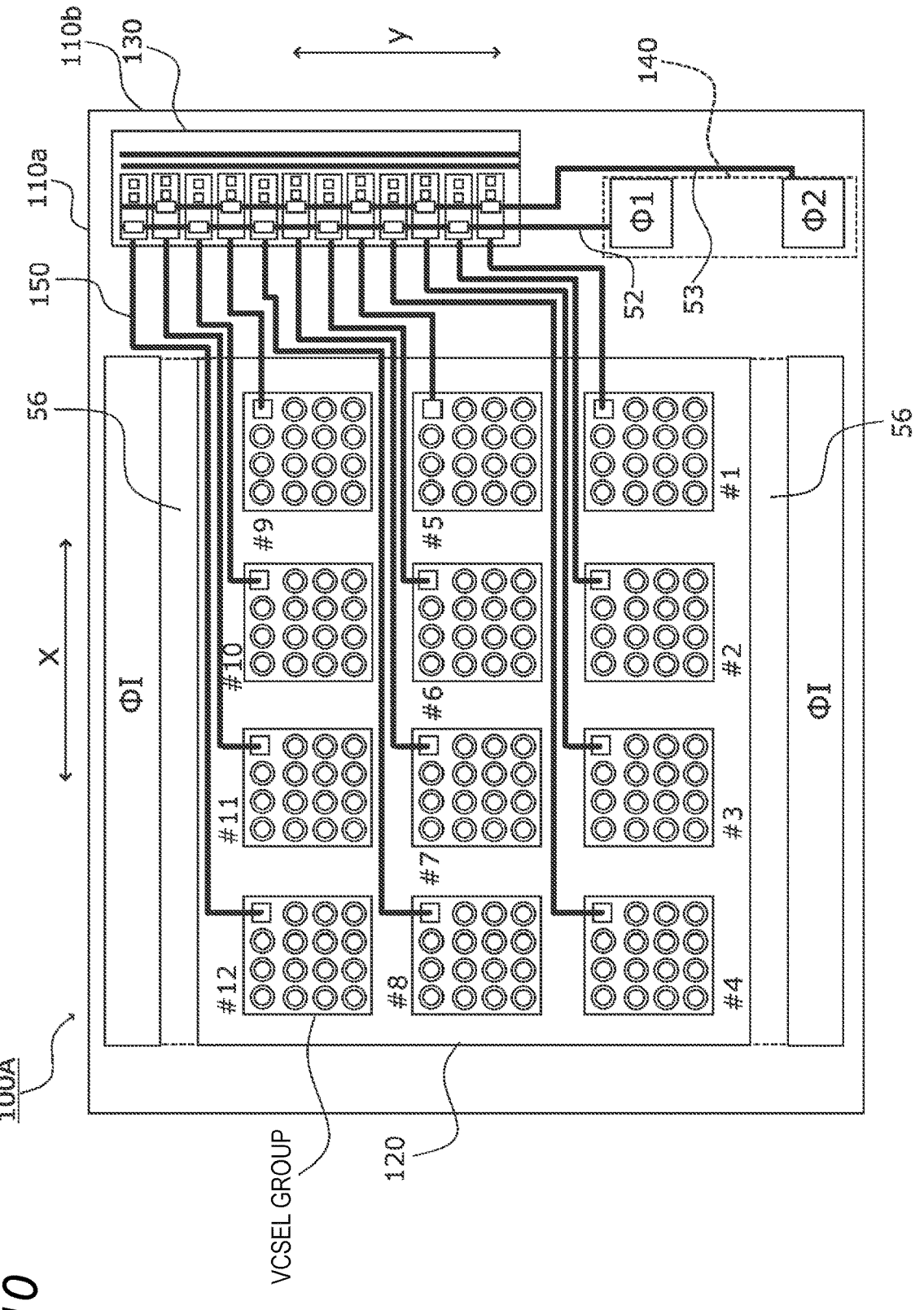
FIG. 10 is a diagram showing an example of a planar layout of a light-emitting device according to a modification.

FIG. 10 is a diagram showing an example of a planar layout of the light-emitting device 100A according to a modification.

In the light-emitting device 100 according to the present exemplary embodiment, a case where there are the Vgk terminal for inputting and outputting the power supply potential Vgk and the Vga terminal for inputting and outputting the reference potential Vga is described, but the Vgk terminal and the Vga terminal can be omitted. In that case, as shown in FIG. 10, between the control unit 200 and the transfer unit 130, the Φ1 terminal and the Φ2 terminal for inputting and outputting the transfer signals Φ1 and Φ2 may be disposed side by side along the short side 110*b* of the substrate 110, respectively. Accordingly, the length of the substrate 110 in the longitudinal direction may be shortened as compared with a case where the Φ1 terminal and the Φ2 terminal are disposed in the long side direction of the substrate 110.

Figure 11:
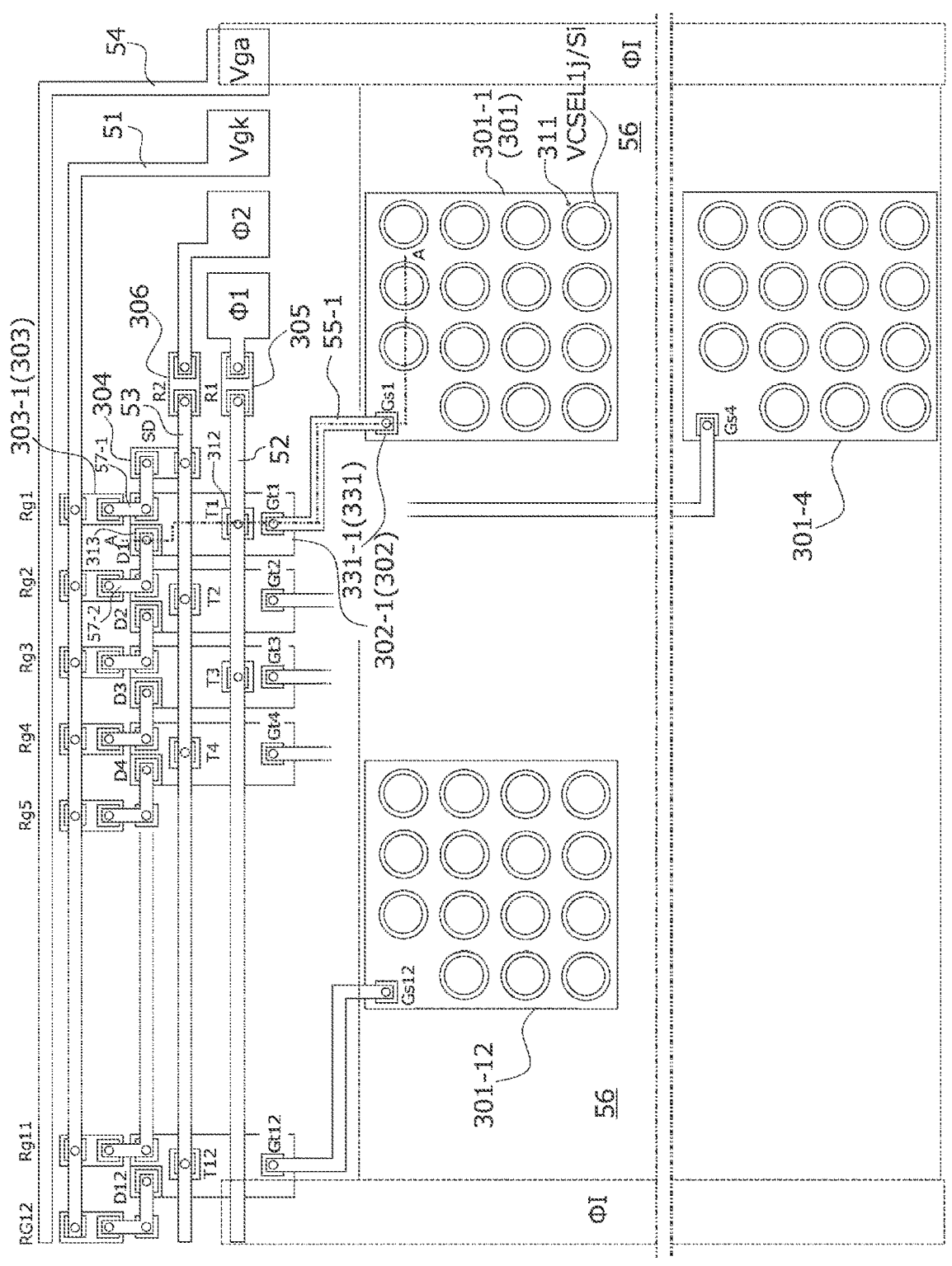
FIG. 11 is a diagram showing an example of the planar layout of the light-emitting device according to the second exemplary embodiment centering on a transfer unit.

FIG. 11 is a diagram showing an example of the planar layout of the light-emitting device 100 according to the second exemplary embodiment centering on the transfer unit 130.

The light-emitting device 100 is formed of a semiconductor material capable of emitting laser light, for example, a GaAs-based compound semiconductor. Then, as shown in a cross-sectional view described later (FIG. 12 described later), the light-emitting device 100 is formed of plural islands in which a semiconductor layer laminate where plural GaAs-based compound semiconductor layers are laminated on the p-type GaAs substrate 110 is separated between elements by mesa etching. Here, the planar layout of the light-emitting device 100 will be described with reference to the islands 301 to 306 shown in FIG. 11. The islands 301, 302, and 303 are provided for each VCSEL group. Therefore, when the islands 301, 302, and 303 are distinguished for each VCSEL group, "i" may be added as described above, and the islands 301-*i*, 302-*i*, and 303-*i* may be described. In FIG. 11, i shows portions from 1 to 12. Further, the number of VCSELs in the VCSEL group is referred to as "j" as described above. Here, j is 1 to 15.

Accordingly, the light-emitting device 100 is configured on a common semiconductor substrate and is miniaturized.

Figure 12:
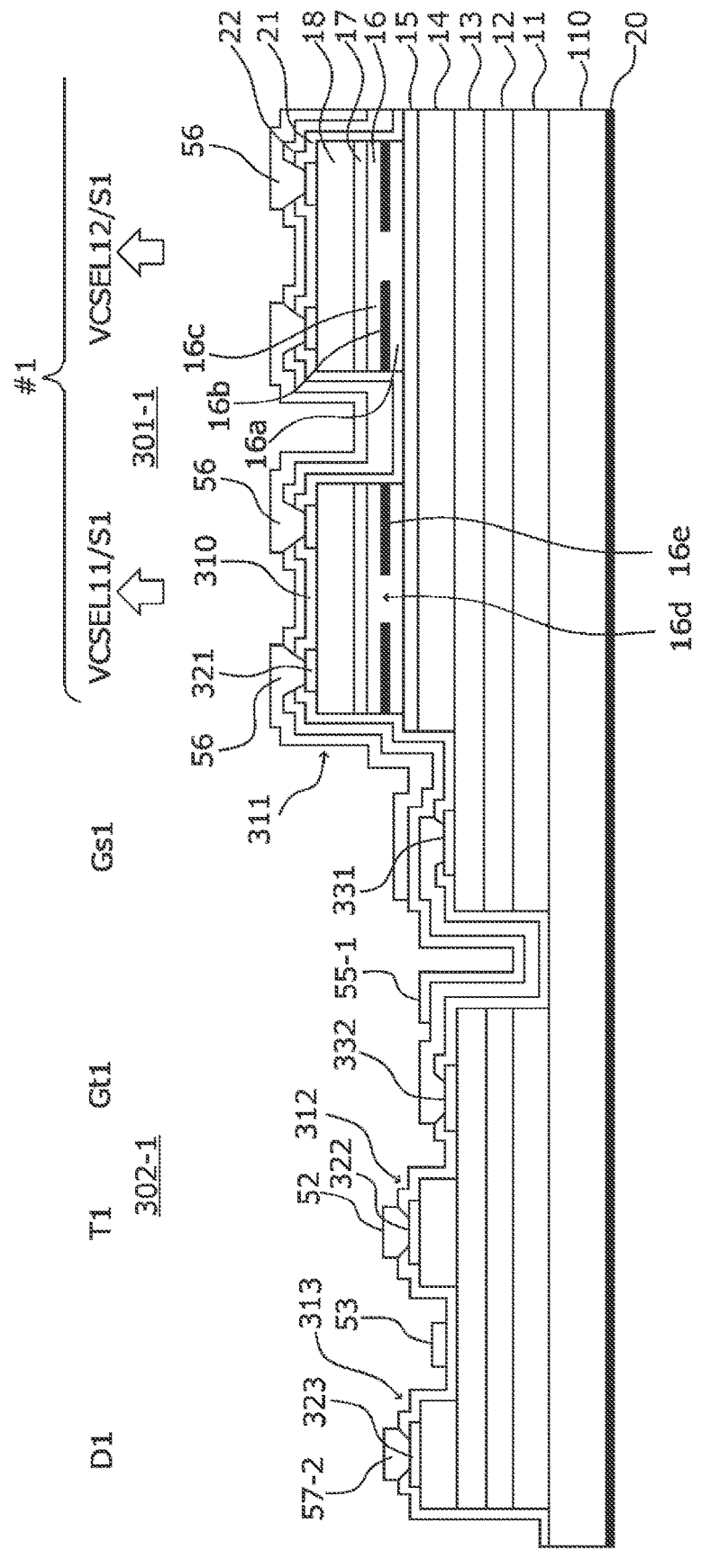
FIG. 12 is a diagram showing a cross-sectional structure of the light-emitting device.

The island 301-*i* is provided with the VCSEL ij and the drive thyristor Si. As shown in FIG. 12, which will be described later, the VCSEL ij and the drive thyristor Si are laminated. In FIG. 11, the VCSEL ij and the drive thyristor Si are referred to as VCSEL ij/Si. For example, when "i" is 1, the VCSEL ij/Si is referred to as VCSEL 1*j*/S1. In FIG. 11, the islands 301-1, 301-4, and 301-12 are shown, and the other islands 301-*i* are omitted. 15 VCSELs are arranged on the island 301-*i*.

The island 302-*i* is provided with the transfer thyristor T1 and the coupling diode Di. The islands 302-*i* are provided so as to be parallel to each other in the y direction (short side direction).

The island 303-*i* is provided with the power supply line resistor Rgi. The islands 303-*i* are provided so as to be parallel to each other in the y direction (short side direction).

The island 304 is provided with the start diode SD. The island 305 is provided with the current limiting resistor R1, and the island 306 is provided with the current limiting resistor R2.

(2-4) Cross-Sectional Structure of Light-Emitting Device

Next, before describing a connection relationship between the islands 301 to 306, a cross-sectional structure of the islands 301 and 302 will be described.

FIG. 12 is a diagram showing a cross-sectional structure of the light-emitting device 100. FIG. 12 is a cross-sectional view of the light-emitting device 100 along a line A-A in FIG. 11. That is, the cross-sectional view shown in FIG. 12 is a cross section that crosses the coupling diode D1, the transfer thyristor T1, the VCSEL 11/S1, and the VCSEL 12/S1 from the left side on a paper surface. The parts of the island 301-1 and the island 302-1 are shown.

Since all the descriptions of the above "(1-4) cross-sectional structure of light-emitting device" are also applied to the light-emitting device 100 according to the second exemplary embodiment, the description will be omitted. However, in the above description of "(1-4) cross-sectional structure of light-emitting device", "FIG. 5" is read as "FIG. 11" and "FIG. 6" is read as "FIG. 12", and the description can be applied to the light-emitting device 100 according to the second exemplary embodiment.

(2-5) Operation of Light-Emitting Device (2-5.1) Thyristor

Since all the descriptions of the above "(1-5.1) thyristor" are also applied to the second exemplary embodiment, the description will be omitted.

(2-5.2) Operations of Laminated Drive Thyristors and VCSEL

Since all the descriptions of the above "(1-5.2) operations of laminated drive thyristors and VCSEL" are also applied to the second exemplary embodiment, the description will be omitted.

(2-6) Measurement Device

Since all the descriptions of the above "(1-6) measurement device" are also applied to the second exemplary embodiment, the description will be omitted.

In the above exemplary embodiment, the VCSEL group is configured such that the light-emitting elements in the same group are adjacent to each other. Accordingly, a region of the VCSEL group is not dispersed, and a configuration such as simplification of the common signal line becomes easy. In that case, since the light-emitting elements connected to the same common signal line can be regarded as one light-emitting group, the region of the VCSEL group is dispersed and the shape of the VCSEL group may not be divided into beautiful partitions.

In the above exemplary embodiment, in the transfer thyristor T1, the on state propagates in order. Accordingly, the transfer thyristor Ti describes an example in which the VCSEL group is sequentially lighted up, but the transfer thyristor Ti further includes a memory unit. In the transfer thyristor Ti, after the on state propagates in order, signals are temporarily stored in the memory unit, and by transmitting the signals to the plural VCSEL groups at the same time, the plural VCSEL groups may be configured to light up all at once.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention defined by the following claims and their equivalents.

REFERENCES SIGNS LIST

1: measurement device, 101: light receiving unit, 102: processing unit, 103: measurement object, 100, 100A, 100B: light-emitting device
110: substrate
120: light-emitting unit
S: drive thyristor, VCSEL: vertical cavity surface emitting laser element
130: transfer unit
Φ1, Φ2: transfer signal, (DI: lighting signal, D: coupling diode, SD: start diode, T: transfer thyristor, Rg: power supply line resistor, R1, R2: current limiting resistor
140: electrode unit
Φ1: Φ1 terminal, 12: Φ2 terminal, Vgk: Vgk terminal, Vga: Vga terminal
150: common signal line
51: power supply line, 52, 53: transfer signal line, 54: reference potential line, 56: lighting signal line, 200: control unit
210: transfer signal generation unit, 220: lighting signal generation unit, 230: power supply potential generation unit, 240: reference potential generation unit, 301 to 306: island

What is claimed is:

1. A light-emitting device comprising:
a substrate;
a light-emitting unit comprising a plurality of light-emitting elements;
a transfer unit configured to output a signal that controls a light-emitting state of the light-emitting elements; and
an electrode unit configured to input and output a signal that drives the transfer unit, wherein
the substrate has a rectangular shape having a long side and a short side,
the electrode unit is disposed along the short side of the substrate with the transfer unit interposed between a part of the electrode unit and other part of the electrode unit,
an area of the light-emitting unit is larger than an area of the transfer unit,
the light-emitting unit comprises a plurality of light-emitting element groups, each of which comprises a plurality of light-emitting elements and is capable of being driven independently from other of the light-emitting element groups, and the plurality of light-emitting element groups is arranged two dimensionally,
the light-emitting device further comprising a light-emitting electrode unit commonly connected to the plurality of light-emitting elements and configured to supply a current to the plurality of light-emitting elements, and the light-emitting electrode unit is formed along the long side of the substrate.

2. The light-emitting device according to claim 1, wherein the electrode unit comprises a plurality of transfer signal electrodes to which a transfer signal for controlling a state where the light-emitting elements are capable of changing to a light-emitting state is given, and a plurality of power supply electrodes configured to give a power supply potential and a reference potential to the transfer unit, and the plurality of transfer signal electrodes and the plurality of power supply electrodes are disposed in a same linear shape with respect to the transfer unit.

3. The light-emitting device according to claim 1, wherein the electrode unit comprises a plurality of transfer signal electrodes to which a transfer signal for controlling a state where the light-emitting elements are capable of changing to a light-emitting state is given, and a plurality of power supply electrodes configured to give a power supply potential and a reference potential to the transfer unit, and the plurality of transfer signal electrodes and the plurality of power supply electrodes are disposed in a direction intersecting the transfer unit.

4. The light-emitting device according to claim 1, wherein the electrode unit comprises a pair of transfer signal electrodes to which a transfer signal for controlling a state where the light-emitting elements are capable of changing to a light-emitting state is given, and the pair of transfer signal electrodes is disposed so as to face each other with the transfer unit interposed between the pair of transfer signal electrodes.

5. The light-emitting device according to claim 1, wherein the transfer unit comprises a first-direction transfer unit configured to output the signal to the light-emitting elements arranged in a first direction and a second-direction transfer unit configured to output the signal to the light-emitting elements arranged in a second direction that intersects the first direction, and neither the first-direction transfer unit nor the second-direction transfer unit is disposed in a direction of the long side of the substrate.

6. The light-emitting device according to claim 1, wherein the electrode unit and the light-emitting electrode unit are disposed side by side in a direction along the long side of the substrate.

7. The light-emitting device according to claim 1, wherein the part of the electrode unit and the other part of the electrode unit is connected to and configured to drive the same transfer unit.

8. A measurement device comprising:
the light-emitting device according to claim 1;
a light receiving unit configured to receive reflected light from an object irradiated with light from the light-emitting device; and
a processing unit configured to measure a distance from the light-emitting device to the object or a three-dimensional shape of the object based on a time from when the object is irradiated with the light from the light-emitting device until when the light is received by the light receiving unit.

9. A light-emitting device comprising:
a substrate;
a light-emitting unit comprising a plurality of light-emitting elements;
a transfer unit configured to output a signal that controls a light-emitting state of the light-emitting elements; and an electrode unit configured to input and output a signal that drives the transfer unit, wherein the substrate has a rectangular shape having a long side and a short side, the transfer unit and the electrode unit are respectively disposed along the short side of the substrate, an area of the light-emitting unit is larger than an area of the transfer unit, the light-emitting unit comprises a plurality of light-emitting element groups, each of which comprises a plurality of light-emitting elements and is capable of being driven independently from other of the light-emitting element groups, and the plurality of light-emitting element groups is arranged two dimensionally, the light-emitting device further comprising a light-emitting electrode unit commonly connected to the plurality of light-emitting elements and configured to supply a current to the plurality of light-emitting elements, and the light-emitting electrode unit is formed along the long side of the substrate.

10. The light-emitting device according to claim 9, wherein the electrode unit comprises a transfer signal electrode to which a transfer signal for controlling a state where the light-emitting elements are capable of changing to a light-emitting state is given, and a power supply electrode configured to give a power supply potential and a reference potential to the transfer unit, and the transfer signal electrode and the power supply electrode are disposed side by side along the short side of the substrate.

11. The light-emitting device according to claim 10, wherein a lighting signal electrode that supplies a current to the light-emitting elements is disposed along the long side of the substrate such that the transfer unit and a portion of the lighting signal electrode overlap in a direction of the short side of the substrate.

12. The light-emitting device according to claim 10, wherein a lighting signal electrode that supplies the current to the light-emitting elements is disposed along the long side of the substrate such that the electrode unit and a portion of the lighting signal electrode overlap in a direction of the short side of the substrate.

13. The light-emitting device according to claim 9, wherein the transfer unit is integrated into one part and disposed along the short side of the substrate.

14. The light-emitting device according to claim 9, further comprising:

a common signal line commonly provided for a light-emitting element group including a plurality of the light-emitting elements, wherein, in the—light-emitting element group, a transfer signal output from the transfer unit to the common signal line causes the light-emitting elements included in the light-emitting element group to emit light at a same time or increases a light-emitting intensity.

15. The light-emitting device according to claim 9, wherein a number of the light-emitting element groups arranged in a direction along the long side of the substrate is larger than a number of the light-emitting element groups arranged in a direction along the short side of the substrate.

16. A measurement device comprising:

the light-emitting device according to claim 9;

a light receiving unit configured to receive reflected light from an object irradiated with light from the light-emitting device; and a processing unit configured to measure a distance from the light-emitting device to the object or a three-dimensional shape of the object based on a time from when the object is irradiated with the light from the light-emitting device until when the light is received by the light receiving unit.

* * * * *